(12) United States Patent
Saito et al.

(10) Patent No.: US 8,674,052 B2
(45) Date of Patent: Mar. 18, 2014

(54) CARBAZOLE NOVOLAK RESIN

(71) Applicant: Nissan Chemical Industries, Ltd., Tokyo (JP)

(72) Inventors: Daigo Saito, Funabashi (JP); Hiroaki Okuyama, Toyama (JP); Hideki Musashi, Funabashi (JP); Tetsuya Shinjo, Toyama (JP); Keisuke Hashimoto, Toyama (JP)

(73) Assignee: Nissan Chemical Industries, Ltd., Tokyo (JP)

( * ) Notice: Subject to any disclaimer, the term of this patent is extended or adjusted under 35 U.S.C. 154(b) by 0 days.

(21) Appl. No.: 13/734,434

(22) Filed: Jan. 4, 2013

(65) Prior Publication Data
US 2013/0122710 A1    May 16, 2013

Related U.S. Application Data

(62) Division of application No. 13/377,055, filed as application No. PCT/JP2010/060223 on Jun. 16, 2010.

(30) Foreign Application Priority Data

Jun. 19, 2009 (JP) ................................ 2009-146289

(51) Int. Cl.
*C08G 59/40* (2006.01)

(52) U.S. Cl.
USPC ........... 528/117; 528/270; 528/423; 438/703; 438/781; 257/E21.219; 257/E21.24; 524/317; 524/597; 524/609; 524/612

(58) Field of Classification Search
USPC ............. 438/703, 781; 527/E21.219, E21.24; 524/317, 597, 609, 612; 528/117, 270, 528/423

See application file for complete search history.

(56) References Cited

U.S. PATENT DOCUMENTS

| 4,954,607 | A | 9/1990 | Otani et al. |
| 7,378,217 | B2 | 5/2008 | Oh et al. |

FOREIGN PATENT DOCUMENTS

| JP | A-01-154050 | 6/1989 |
| JP | A-02-22657 | 1/1990 |

(Continued)

OTHER PUBLICATIONS

Sep. 21, 2010 Written Opinion issued in International Patent Application No. PCT/JP2010/060223 (with translation).

(Continued)

*Primary Examiner* — Shane Fang
(74) *Attorney, Agent, or Firm* — Oliff PLC

(57) ABSTRACT

There is provided a resist underlayer film having heat resistance that is used for a lithography process in the production of semiconductor devices, and a high refractive index film having transparency that is used for an electronic device. A polymer comprising a unit structure of Formula (1):

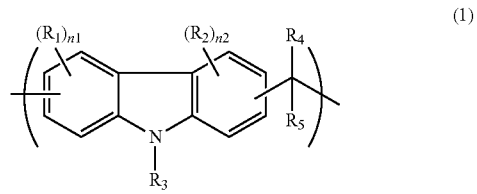

wherein each of $R_1$, $R_2$, $R_3$, and $R_5$ may be a hydrogen atom, $R_4$ may be phenyl group or naphthyl group. A resist underlayer film forming composition comprising the polymer, and a resist underlayer film formed from the composition. A high refractive index film forming composition comprising the polymer, and a high refractive index film formed from the composition.

4 Claims, 12 Drawing Sheets

(56) References Cited

FOREIGN PATENT DOCUMENTS

| | | |
|---|---|---|
| JP | A-02-160731 | 6/1990 |
| JP | A-02-293850 | 12/1990 |
| JP | A-10-152636 | 6/1998 |
| JP | A-10-193554 | 7/1998 |
| JP | A-2005-128509 | 5/2005 |
| JP | A-2007-178974 | 7/2007 |
| JP | A-2007-199653 | 8/2007 |
| JP | A-2007-297540 | 11/2007 |

OTHER PUBLICATIONS

Sep. 21, 2010 International Search Report issued in International Patent Application No. PCT/JP2010/060223.

Aug. 8, 2013 Office Action issued in U.S. Appl. No. 13/377,055.

CARBAZOLE NOVOLAK RESIN

This is a Division of application Ser. No. 13/377,055 filed Dec. 8, 2011, which in turn is a 371 of International Application No. PCT/JP2010/060223, filed Jun. 16, 2010, which claims the benefit of Japanese Patent Application No. JP2009-146289 filed Jun. 19, 2009. The disclosure of the prior applications is hereby incorporated by reference herein in its entirety.

TECHNICAL FIELD

The present invention relates to a carbazole novolak resin including a particular structure. It further relates to a resist underlayer film forming composition including the carbazole novolak resin, a resist underlayer film formed from the composition, a resist pattern forming method using the resist underlayer film forming composition, and a production method of a semiconductor device. It also relates to a high refractive index film forming composition including the carbazole novolak resin, a high refractive index film that is formed from the composition and has transparency in a visible region, and an electronic device including the high refractive index film.

BACKGROUND ART

Conventionally, microfabrication of semiconductor substrates has been carried out by lithography using a photoresist composition in the production of semiconductor devices. For the microfabrication of semiconductor substrates, there is a known fabrication method in which a resist film formed from a photoresist composition is formed on a substrate to be fabricated such as a silicon wafer, active rays such as ultraviolet rays are applied onto the resist film through a mask pattern with a pattern that is transferred to a semiconductor device, the resist thin film is developed for patterning, and the substrate to be fabricated such as a silicon wafer is etched using the obtained photoresist pattern as a protective film to transfer the pattern to the substrate.

In recent years, highly integrated semiconductor devices require a finer resist pattern. To address this, the active rays used for the patterning of resist films have been likely to have a shorter wavelength from a KrF excimer laser (248 nm) to an ArF excimer laser (193 nm). However, the use of active rays having a short wavelength has a higher possibility of causing significant problems such as resolution reduction due to the effects of irregular reflections of the applied active rays from a substrate and standing waves. In order to solve such a problem, a bottom anti-reflective coating (BARC) has been widely employed between the photoresist and the substrate to be fabricated as a resist underlayer film.

In future, when a finer resist pattern will be further developed, a thinner resist will be required in order to prevent problems such as the resolution reduction and collapse of a resist pattern after development. However, the thinner resist cannot provide a resist pattern film thickness sufficient for the fabrication of a substrate. To address this, there is required a process for imparting a function as a mask during the substrate fabrication to a resist underlayer film that is formed between the resist and a semiconductor substrate to be fabricated in addition to the resist pattern.

As the resist underlayer film for such a process, unlike a conventional resist underlayer film having a high etching rate, a resist underlayer film having a similar selection ratio of dry etching rate to that of a resist, a resist underlayer film having a smaller selection ratio of dry etching rate than that of a resist, or a resist underlayer film having a smaller selection ratio of dry etching rate than that of a semiconductor substrate is used.

There are known resist underlayer film forming compositions including various polymers for forming the resist underlayer film. For example, there are disclosed a resist underlayer film forming composition including polyvinylcarbazole (see Patent Document 1, Patent Document 2, and Patent Document 3), a resist underlayer film forming composition including a fluorene phenol novolak resin (for example, see Patent Document 4), a resist underlayer film forming composition including a fluorene naphthol novolak resin (for example, see Patent Document 5), and a resist underlayer film forming composition including a resin containing a fluorene phenol and an aryl alkylene as repeating units (for example, see Patent Document 6 and Patent Document 7).

There is also disclosed a novolak resin that is used as an insulating material for printed wiring, boards and the like, has high heat resistance, and uses carbazole and acetaldehyde (see Patent Document 8).

RELATED ART DOCUMENTS

Patent Documents

Patent Document 1: Japanese Patent Application Publication No. JP-A-2-293850
Patent Document 2: Japanese Patent Application Publication No. JP-A-1-154050
Patent Document 3: Japanese Patent Application Publication No. JP-A-2-22657
Patent Document 4: Japanese Patent Application Publication No. JP-A-2005-128509
Patent Document 5: Japanese Patent Application Publication No. JP-A-2007-199653
Patent Document 6: Japanese Patent Application Publication No. JP-A-2007-178974
Patent Document 7: U.S. Pat. No. 7,378,217
Patent Document 8: Japanese Patent Application Publication No. JP-A-2007-297540

DISCLOSURE OF THE INVENTION

Problem to be Solved by the Invention

It is an object of the present invention to provide a novel carbazole novolak resin including a particular structure. Another object of the present invention is to provide a resist underlayer film forming composition that includes the carbazole novolak resin and is used for a lithography process in the production of semiconductor devices. Another object of the present invention is to provide a resist underlayer film that is formed from the resist underlayer film forming composition, planarizes a substrate, can provide an excellent resist pattern without causing intermixing with a resist, has a similar selection ratio of dry etching rate to that of a resist or a smaller selection ratio of dry etching rate than those of a resist and a semiconductor substrate, has a characteristic of efficiently adsorbing reflected, light from a substrate when irradiation light having a wavelength of 248 nm, 193 nm, 157 nm, or the like is used for the microfabrication of a resist, and has heat resistance to a high temperature treatment during substrate fabrication such as the formation of a resist layer and the formation of a hard mask. Another object of the present invention is to provide a method for forming a resist pattern using the resist underlayer film forming composition. Another object of the present invention is to provide a production method of a semiconductor device, the production method including a lithography process using the resist underlayer film forming composition.

Furthermore, it is an object of the present invention to provide a high refractive index film that has transparency in a visible region, a high refractive index film forming composition for forming the film, and an electronic device including the high refractive index film, using singular characteristics of the carbazole novolak resin.

Means for Solving the Problem

The present invention relates to a polymer having a particular structure shown below, namely, a carbazole novolak resin, a resist underlayer film forming composition including the resin, a resist underlayer film formed from the composition, and a production method of a semiconductor device using the film. The present invention also relates to a high refractive index film forming composition including the carbazole novolak resin, a high refractive index film formed from the composition, and an electronic device including the film.

Namely, the present invention relates to, as a first aspect, a polymer including a unit structure of Formula (1):

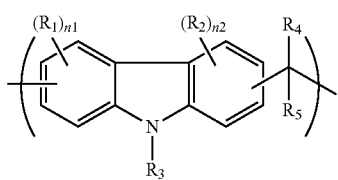

Formula (1)

(in Formula (1), each of $R_1$ and $R_2$ is a group selected from a group consisting of a hydrogen atom, a halogen group, a nitro group, an amino group, a hydroxy group, a $C_{1-10}$ alkyl group, a $C_{2-10}$ alkenyl group, a $C_{6-40}$ aryl group, and a combination of them, the alkyl group, the alkenyl group, or the aryl group optionally containing an ether linkage, a ketone linkage, or an ester linkage; $R_3$ is a group selected, from a group consisting of a hydrogen atom, a $C_{1-10}$ alkyl group, as $C_{2-10}$ alkenyl group, a $C_{6-40}$ aryl group, and a combination of them, the alkyl group, the alkenyl group, or the aryl group optionally containing an ether linkage, a ketone linkage, or an ester linkage; $R_4$ is a $C_{6-40}$ aryl group or a heterocyclic group optionally substituted with to halogen group, a nitro group, an amino group, or a hydroxy group; $R_5$ is a hydrogen atom or a $C_{1-10}$ alkyl group, a $C_{6-40}$ aryl group, or a heterocyclic group optionally substituted with a halogen group, a nitro group, an amino group, or a hydroxy group; $R_4$ and $R_5$ optionally form a ring together with a carbon atom, the carbon atom being bonded to $R_4$ and $R_5$; and each of n1 and n2 is an integer of 1 to 3);

as a second aspect, the polymer according to the first aspect including the unit structure of Formula (1), where each of $R_1$, $R_2$, $R_3$, and $R_5$ is a hydrogen atom and $R_4$ is a phenyl group or a naphthyl group;

as a third aspect, the polymer according to the first aspect including the unit structure of Formula (1), where each of $R_1$, $R_2$ and $R_3$ is a hydrogen atom and $R_4$ and $R_5$ form a fluorene ring together with a carbon atom, the carbon atom being bonded to $R_4$ and $R_5$ and being C-9 in the formed fluorene ring;

as a fourth aspect, a polymer including a unit structure of Formula (2) and/or Formula (3):

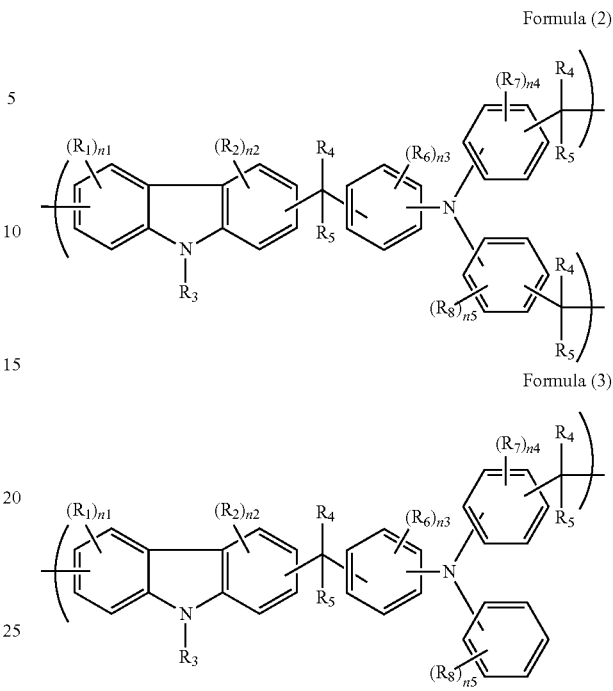

Formula (2)

Formula (3)

(in Formula (2) and Formula (3), each of $R_1$, $R_2$, $R_6$, $R_7$, and $R_8$ is a group selected from a group consisting of a hydrogen atom, a halogen group, a nitro group, an amino group, a hydroxy group, a $C_{1-10}$ alkyl group, a $C_{2-10}$ alkenyl group, a $C_{6-40}$ aryl group, and a combination of them, the alkyl group, the alkenyl group, or the aryl group optionally containing an ether linkage, a ketone linkage, or an ester linkage; $R_3$ is a group selected from a group consisting of a hydrogen atom, a $C_{1-10}$ alkyl group, a $C_{2-10}$ alkenyl group, a $C_{6-40}$ aryl group, and a combination of them, the alkyl group, the alkenyl group, or the aryl group optionally containing an ether linkage, a ketone linkage, or an ester linkage; $R_4$ is a $C_{6-40}$ aryl group or a heterocyclic group optionally substituted with a halogen group, as nitro group, an amino group, or a hydroxy group; $R_5$ is a hydrogen atom or a $C_{1-10}$ alkyl group, a $C_{6-40}$ aryl group, or a heterocyclic group optionally substituted with a halogen group, a nitro group, an amino group, or a hydroxy group; $R_4$ and $R_5$ optionally form a ring together with a carbon atom, the carbon atom being bonded to $R_4$ and $R_5$; each of n1 and n2 is an integer of 1 to 3; and each of n3 to n5 is an integer of 1 to 4);

as a fifth aspect, the polymer according to the fourth aspect including the unit structure of Formula (2) and/or Formula (3), where each of $R_1$, $R_2$, $R_3$, $R_5$, $R_6$, $R_7$, and $R_8$ is a hydrogen atom and $R_4$ is a phenyl group or a naphthyl group;

as a sixth aspect, a resist underlayer film forming composition including the polymer as described in any one of the first aspect to the fifth aspect;

as a seventh aspect, the resist underlayer film forming composition according to the sixth aspect further including a cross-linking agent;

as an eighth aspect, the resist underlayer film forming composition according to the sixth aspect of the seventh aspect further including an acid and/or an acid generator;

as a ninth aspect, a resist underlayer film produced by applying the resist underlayer film forming composition as described in any one of the sixth aspect to the eighth aspect on a semiconductor substrate and baking the resultant coating;

as a tenth aspect, a method for forming a resist pattern used in production of a semiconductor, the method including applying the resist underlayer film forming composition as described in any one of the sixth aspect to the eighth aspect on a semiconductor substrate and baking the resultant coating to form an underlayer film;

as an eleventh aspect, a production method of a semiconductor device, the method including forming a resist underlayer film on a semiconductor substrate from the resist underlayer film forming composition as described in any one of the sixth aspect to the eighth aspect; forming a resist film on the resist underlayer film; forming as resist pattern on the resist film by application of light or an electron beam and development; etching the underlayer film according to the resist pattern; and fabricating the semiconductor substrate using the patterned underlayer film;

as a twelfth aspect, a production method of a semiconductor device, the method including forming a resist underlayer film on a semiconductor substrate from the resist underlayer film forming composition as described in any one of the sixth aspect to the eighth aspect; forming a hard mask on the resist underlayer film; further forming a resist film on the hard mask; forming a resist pattern on the resist film by application of light or an electron beam and development; etching the hard mask according to the resist pattern; etching the resist underlayer film according to the patterned hard mask; and fabricating the semiconductor substrate using the resist patterned underlayer film;

as a thirteenth aspect, the production method according to the twelfth aspect, in which the hard mask is formed by depositing an inorganic substance on the resist underlayer film;

as a fourteenth aspect, a high refractive index film forming composition including a polymer containing at least one unit structure selected from a group consisting of a unit structure of Formula (1), a unit structure of Formula (2), and a unit structure of Formula (3);

as a fifteenth aspect, a high refractive index film produced by applying the high refractive index film forming composition as described in the fourteenth aspect; and as a sixteenth aspect, an electronic device including the high refractive index film as described in the fifteenth aspect.

Effects of the Invention

The resist underlayer film forming composition of the present invention can form a resist underlayer film that does not cause intermixing with a layer covered on the resist underlayer film. The resist underlayer film forming composition of the present invention can also form an excellent resist underlayer film that has a similar selection ratio of dry etching rate to that of a resist or a smaller selection ratio of dry etching rate than those of a resist and a semiconductor substrate. The resist underlayer film forming composition of the present invention can also form a resist underlayer film that has high heat resistance even under a high temperature condition, for example, in a thermal curing process for forming a resist film and in a vacuum deposition process for forming a hard mask. The resist underlayer film forming composition of the present invention can also form a resist underlayer film that also has an advantage as an anti-reflective coating to suppress reflections alight or electron beams from is substrate because the composition includes a polymer containing a skeletal structure that can absorb the light or electron beams. The resist underlayer film forming composition of the present invention can also form a resist underlayer film that has sufficient anti-etching properties with respect to a semiconductor substrate for example, a thermal silicon oxide film, a silicon nitride film, and a polysilicon film on a substrate).

The resist underlayer film of the present invention can be used as a planarizing film, an anti-reflective coating, an anti-pollution film for a resist layer, a film having heat resistance, and a film having dry etching selectivity and anti-etching properties. Hence, the resist underlayer film can lead to easy and accurate resist pattern formation and resist pattern transfer to a semiconductor substrate in a lithography process in the production of semiconductor devices. In particular, the resist underlayer turn has high heat resistance, and thus can be suitably used for a lithography process including a process of forming a hard mask by deposition of an inorganic substance in the production of semiconductor devices.

The carbazole novolak resin including a particular structure of the present invention has excellent transparency in a visible light region, excellent heat resistance, high refractive index, and excellent solubility in various solvents. Thus, the high refractive index, film forming composition that includes the carbazole novolak resin including a particular structure of the present invention can form a high refractive index film that is used for, for example, a protective film for a liquid crystal display device, a TFT array planarizing film, an overcoat for a color filter and the like, a spacer material, a film for improving light extraction of an EL display, a layer for improving light receiving of an image sensing device, and a layer for improving light extraction in an LED device. The high refractive index film of the present invention can be widely used as an optical member of electronic devices.

BEST MODE FOR CARRYING OUT THE INVENTION

<Carbazole Novolak Resin>

Figure 1:
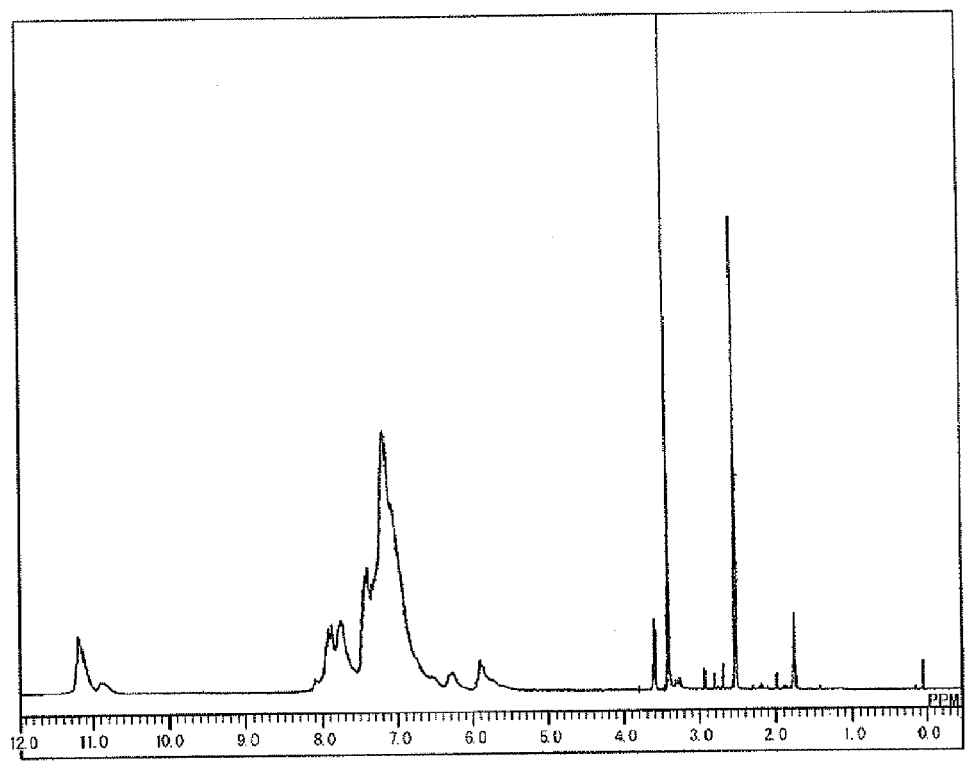
FIG. 1 is a $^1$H-NMR spectrum of a polymer obtained in Synthetic Example 1.

The present invention relates to a polymer including as unit structure of Formula (1) or the present invention relates to a polymer including a unit structure of Formula (2) and/or Formula (3), namely, a carbazole novolak resin including a particular structure.

In Formula (1), each of $R_1$ and $R_2$ is exemplified by a group selected from a group consisting of a hydrogen atom, a halogen group, a nitro group, an amino group, a hydroxy group, as $C_{1-10}$ alkyl group, a $C_{2-10}$ alkenyl group, a $C_{6-40}$ aryl group, and a combination of them, where the alkyl group, the alkenyl group, or the aryl group may contain an ether linkage, as ketone linkage, or an ester linkage.

In Formula (1), $R_3$ is exemplified by a group selected from as group consisting of a hydrogen atom, a $C_{1-10}$ alkyl group, as $C_{2-10}$ alkenyl group, a $C_{6-40}$ aryl group, and a combination of them, where the alkyl group, the alkenyl group, or the aryl group may contain an ether linkage, a ketone linkage, or an ester linkage.

In Formula (1), $R_4$ is exemplified by a $C_{6-40}$ aryl group or a heterocyclic group that may be substituted with a halogen group, a nitro group, an amino group, or a hydroxy group.

In Formula (1), $R_5$ is exemplified, by a hydrogen atom or a $C_{1-10}$ alkyl group, a $C_{6-40}$ aryl group, or a heterocyclic group that may be substituted with a halogen group, a nitro group, an amino group, or a hydroxy group. $R_4$ and $R_5$ may form a ring together with the carbon atom that is bonded to $R_4$ and $R_5$. Such a ring is exemplified by a fluorene ring formed from $R_4$ and $R_5$ together with the carbon atom that is bonded to $R_4$ and $R_5$ and is at the 9-position in the formed fluorene ring. Each of n1 and n2 is an integer of 1 to 3.

In Formula (2) and Formula (3), each of $R_1$, $R_2$, $R_6$, $R_7$, and $R_8$ is exemplified by a group selected from a group consisting of a hydrogen atom, a halogen group, a nitro group, an amino group, a hydroxy group, a $C_{1-10}$ alkyl group, a $C_{2-10}$ alkenyl group, a $C_{6-40}$ aryl group, and a combination of them, where the alkyl group, the alkenyl group, or the aryl group may contain an ether linkage, a ketone linkage, or an ester linkage.

In Formula (2) and Formula (3), $R_3$ is exemplified, by a group selected from a group consisting of a hydrogen atom, a $C_{1-10}$ alkyl group, a $C_{2-10}$ alkenyl group, a $C_{6-40}$ aryl group, and a combination of them, where the alkyl group, the alkenyl group, or the aryl group may contain an ether linkage, a ketone linkage, or an ester linkage.

In Formula (2) and Formula (3), $R_4$ is exemplified by a $C_{6-40}$ aryl group or a heterocyclic group that may be substituted with a halogen group, a nitro group, an amino group, or a hydroxy group.

In Formula (2) and Formula (3), $R_5$ is exemplified by a hydrogen atom or a $C_{1-10}$ alkyl group, a $C_{6-40}$ aryl group, or a heterocyclic group that may be substituted with a halogen group, a nitro group, an amino group, or a hydroxy group. $R_4$ and $R_5$ may form a ring together with the carbon atom that is bonded to $R_4$ and $R_5$. Such a ring is exemplified by a fluorene ring structure that is a fluorene ring formed from $R_4$ and $R_5$ together with the carbon atom that is bonded to $R_4$ and $R_5$ and is at the 9-position in the formed fluorene ring.

Each of n1 and n2 is an integer of 1 to 3, and each of n3 to n5 is an integer of 1 to 4.

Examples of the halogen group include a fluoro group, a chloro group, a bromo group, and an iodine group.

Examples of the $C_{1-10}$ alkyl group include a methyl group, an ethyl group, an n-propyl group, an i-propyl group, a cyclopropyl group, an n-butyl group, an i-butyl group, an s-butyl group, a t-butyl group, a cyclobutyl group, a 1-methyl-cyclopropyl group, a 2-methyl-cyclopropyl group, an n-pentyl group, a 1-methyl-n-butyl group, a 2-methyl-n-butyl group, a 3-methyl-n-butyl group, a 1,1-dimethyl-n-propyl group, a 1,2-dimethyl-n-propyl group, a 2,2-dimethyl-n-propyl group, a 1-ethyl-n-propyl group, a cyclopentyl group, a 1-methyl-cyclobutyl group, a 2-methyl-cyclobutyl group, a 3-methyl-cyclobutyl group, a 1,2-dimethyl-cyclopropyl group, a 2,3-dimethyl-cyclopropyl group, a 1-ethyl-cyclopropyl group, a 2-ethyl-cyclopropyl group, an n-hexyl group, a 1-methyl-n-pentyl group, a 2-methyl-n-pentyl group, a 3-methyl-n-pentyl group, a 4-methyl-n-pentyl group, a 1,1-dimethyl-n-butyl group, a 1,2-dimethyl-n-butyl group, a 1,3-dimethyl-n-butyl group, a 2,2-dimethyl-n-butyl group, a 2,3-dimethyl-n-butyl group, a 3,3-dimethyl-n-butyl group, a 1-ethyl-n-butyl group, a 2-ethyl-n-butyl group, a 1,1,2-trimethyl-n-propyl group, as 1,2,2-trimethyl-n-propyl group, a 1-ethyl-1-methyl-n-propyl group, a 1-ethyl-2-methyl-n-propyl group, a cyclohexyl group, a 1-methyl-cyclopentyl group, a 2-methyl-cyclopentyl group, a 3-methyl-cyclopentyl group, a 1-ethyl-cyclobutyl group, a 2-ethyl-cyclobutyl group, a 3-ethyl-cyclobutyl group, a 1,2-dimethyl-cyclobutyl group, a 1,3-dimethyl-cyclobutyl group, a 2,2-dimethyl-cyclobutyl group, a 2,3-dimethyl-cyclobutyl group, a 2,4-dimethyl-cyclobutyl group, a 3,3-dimethyl-cyclobutyl group, as 1-n-propyl-cyclopropyl group, a 2-n-propyl-cyclopropyl group, a 1-i-propyl-cyclopropyl group, a 2-i-propyl-cyclopropyl group, to 1,2,2-trimethyl-cyclopropyl group, a 1,2,3-trimethyl-cyclopropyl group, a 2,2,3-trimethyl-cyclopropyl group, a 1-ethyl-2-methyl-cyclopropyl group, a 2-ethyl-1-methyl-cyclopropyl group, a 2-ethyl-2-methyl-cyclopropyl, and a 2-ethyl-3-methyl-cyclopropyl group.

Examples of the $C_{2-10}$ alkenyl group include an ethenyl group, a 1-propenyl group, a 2-propenyl group, a 1-methyl-1-ethenyl group, a 1-butenyl group, a 2-butenyl group, a 3-butenyl group, a 2-methyl-1-propenyl group, a 2-methyl-2-propenyl group, a 1-ethylethenyl group, a 1-methyl-1-propenyl group, a 1-methyl-2-propenyl group, a 1-pentenyl group, a 2-pentenyl group, a 3-pentenyl group, a 4-pentenyl group, a 1-n-propylethenyl group, a 1-methyl-1-butenyl group, a 1-methyl-2-butenyl group, a 1-methyl-3-butenyl group, a 2-ethyl-2-propenyl group, a 2-methyl-1-butenyl group, a 2-methyl-2-butenyl group, a 2-methyl-3-butenyl group, a 3-methyl-1-butenyl group, a 3-methyl-2-butenyl group, a 3-methyl-3-butenyl group, a 1,1-dimethyl-2-propenyl group, a 1-i-propylethenyl group, a 1,2-dimethyl-1-propenyl group, a 1,2-dimethyl-2-propenyl group, a 1-cyclopentenyl group a 2-cyclopentenyl group, a 3-cyclopentenyl group, a 1-hexenyl group, a 2-hexenyl group, a 3-hexenyl group, a 4-hexenyl group, a 5-hexenyl group, a 1-methyl-1-pentenyl group, a 1-methyl-2-pentenyl group, as 1-methyl-3-pentenyl group, a 1-methyl-4-pentenyl group, a 1-n-butylethenyl group, a 2-methyl-1-pentenyl group, a 2-methyl-2-pentenyl group, a 2-methyl-3-pentenyl group, a 2-methyl-4-pentenyl group, a 2-n-propyl-2-propenyl group, a 3-methyl-1-pentenyl group, a 3-methyl-2-pentenyl group, a 3-methyl-3-pentenyl group, a 3-methyl-4-pentenyl group, a 3-ethyl-3-butenyl group, a 4-methyl-1-pentenyl group, a 4-methyl-2-pentenyl group, a 4-methyl-3-pentenyl group, a 4-methyl-4-pentenyl group, a 1,1-dimethyl-2-butenyl group, a 1,1-dimethyl-3-butenyl group, as 1,2-dimethyl-1-butenyl group, a 1,2-dimethyl-2-butenyl group, a 1,2-dimethyl-3-butenyl group, a 1-methyl-2-ethyl-2-propenyl group, a 1-s-butylethenyl group, a 1,3-dimethyl-1-butenyl group, a 1,3-dimethyl-2-butenyl group, a 1,3-dimethyl-3-butenyl group, a 1-i-butylethenyl group, a 2,2-dimethyl-3-butenyl group, a 2,3-dimethyl-1-butenyl group, a 2,3-dimethyl-2-butenyl group, a 2,3-dimethyl-3-butenyl group, a 2-i-propyl-2-propenyl group, a 3,3-dimethyl-1-butenyl group, a 1-ethyl-1-butenyl group, a 1-ethyl-2-butenyl group, a 1-ethyl-3-butenyl group, a 1-n-propyl-1-propenyl group, a 1-n-propyl-2-propenyl group, a 2-ethyl-1-butenyl group, a 2-ethyl-2-butenyl group, a 2-ethyl-3-butenyl group, a 1,1,2-trimethyl-2-propenyl group, a 1-t-butylethenyl group, a 1-methyl-1-ethyl-2-propenyl group, a 1-ethyl-2-methyl-1-propenyl group, a 1-ethyl-2-methyl-2-propenyl group, a 1-i-propyl-1-propenyl group, a 1-i-propyl-2-propenyl group, a 1-methyl-2-cyclopentenyl group, a 1-methyl-3-cyclopentenyl group, a 2-methyl-1-cyclopentenyl group, a 2-methyl-2-cyclopentenyl group, a 2-methyl-3-cyclopentenyl group, a 2-methyl-4-cyclopentenyl group, a 2-methyl-5-cyclopentenyl group, a 2-methylene-cyclopentyl group, a 3-methyl-1-cyclopentenyl group, a 3-methyl-2-cyclopentenyl group, a 3-methyl-3-cyclopentenyl group, a 3-methyl-4-cyclopentenyl group, a 3-methyl-5-cyclopentenyl group, a 3-methylene-cyclopentyl group, as 1-cyclohexenyl group, is 2-cyclohexenyl group, and 3-cyclohexenyl group.

Examples of the $C_{6-40}$ aryl group include a phenyl group, an o-methylphenyl group, a m-methylphenyl group, a p-methylphenyl group, an o-chlorophenyl group, a m-chlorophenyl group, a p-chlorophenyl group, an o-fluorophenyl group, a p-fluorophenyl group, an o-methoxyphenyl group, a p-methoxyphenyl group, a p-nitrophenyl group, a p-cyanophenyl group, an α-naphthyl group, a β-naphthyl group, an o-biphenyl group, a m-biphenyl group, a p-biphenyl group, a 1-anthryl group, as 2-anthryl group, a 9-anthryl group, a 1-phenanthryl group, to 2-phenanthryl group, a 3-phenanthryl group, a 4-phenanthryl group, and a 9-phenanthryl group.

The heterocyclic group is preferably, for example, an organic group composed of a 5- to 6-membered heterocyclic ring containing nitrogen, sulfur, or oxygen, and examples include a pyrrole group, a furan group, a thiophene group, an imidazole group, an oxazole group, a thiazole group, a pyrazole group, an isoxazole group, an isothiazole group, and a pyridine group.

The polymer containing a preferred unit structure as Formula (1) can be exemplified below.

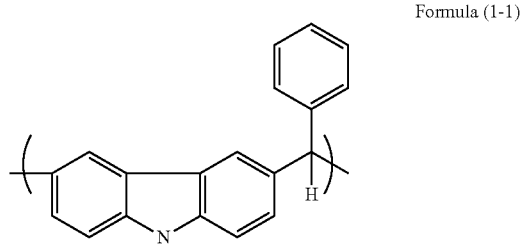

Formula (1-1)

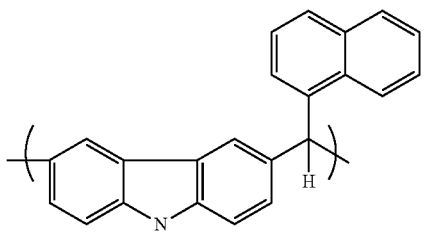

Formula (1-2)

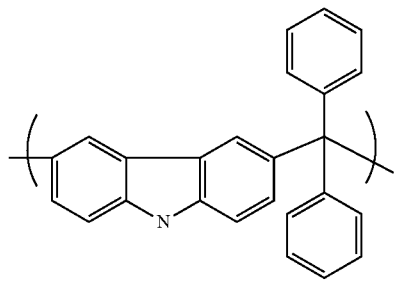

Formula (1-3)

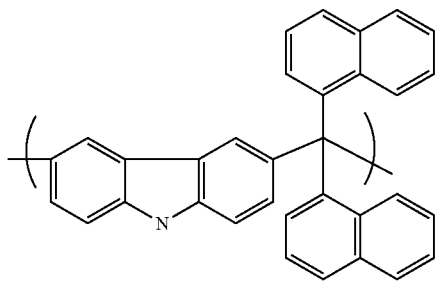

Formula (1-4)

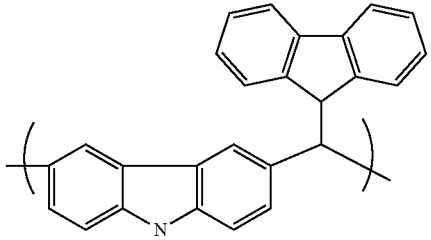

Formula (1-5)

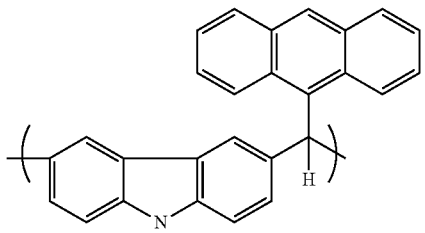

Formula (1-6)

Formula (1-7)
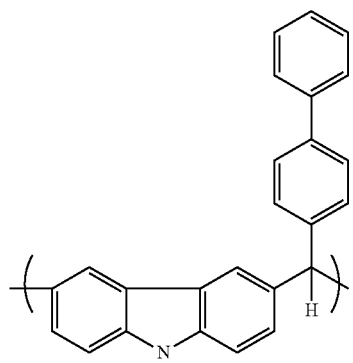
Formula (1-8)
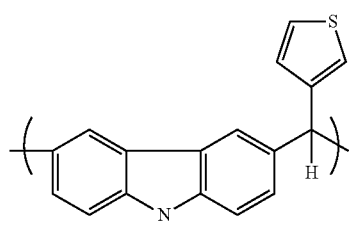
Formula (1-9)
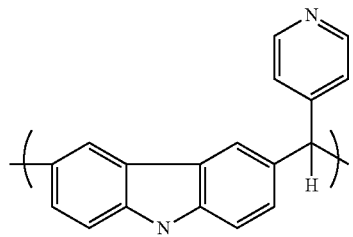
Formula (1-10)
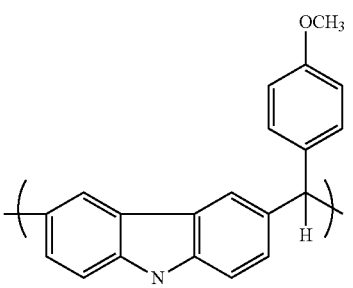
Formula (1-11)
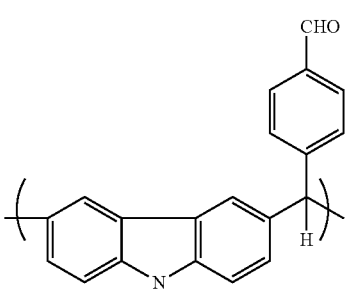
Formula (1-12)
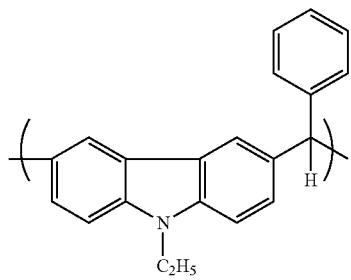
Formula (1-13)
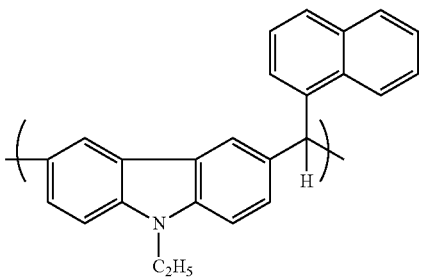
The polymer containing a preferred unit structure as Formula (2) or Formula (3) can be exemplified below.
Formula (2-1)
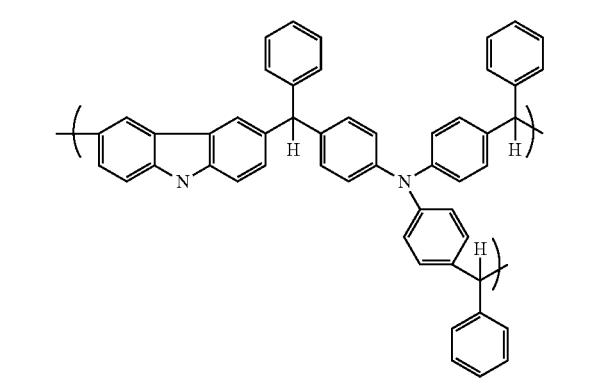
Formula (2-2)
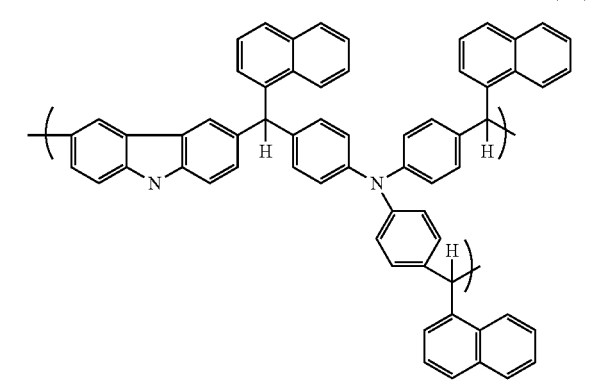

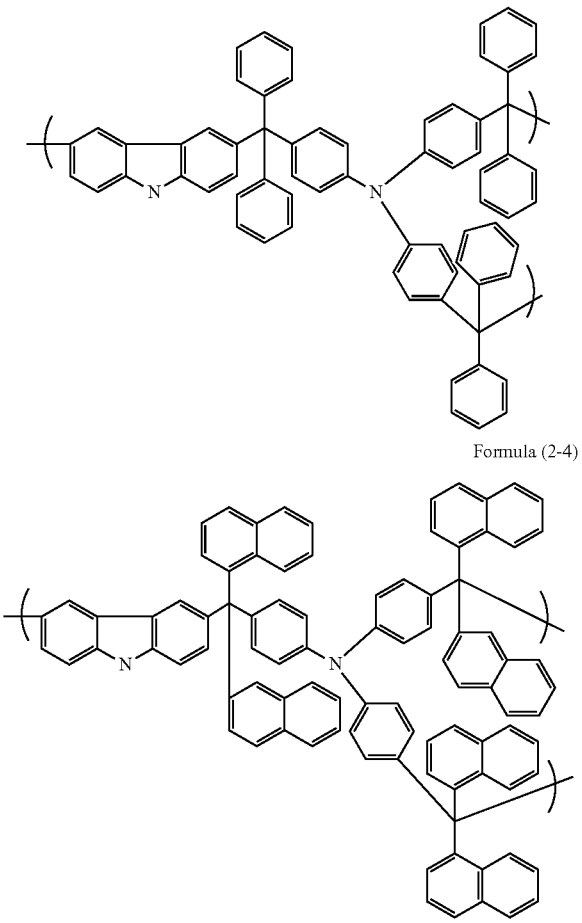

Formula (2-3)

Formula (2-4)

Formula (2-5)

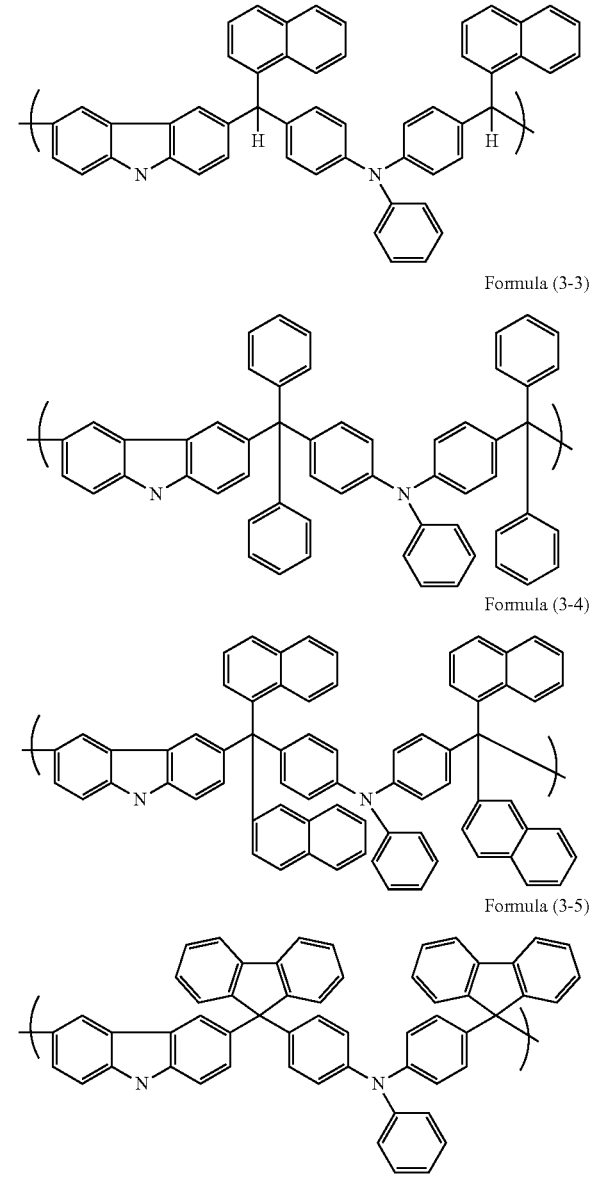

Formula (3-2)

Formula (3-3)

Formula (3-4)

Formula (3-5)

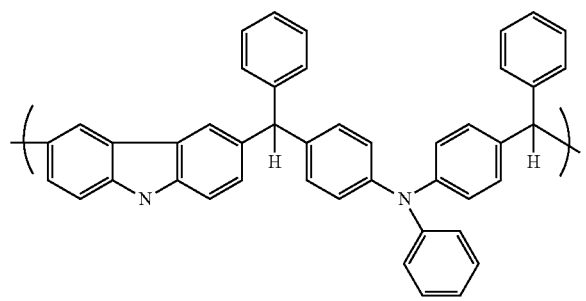

Formula (3-1)

The polymer of Formula (1) of the present invention can be obtained by condensation of carbazoles with aldehydes or ketones. In the condensation reaction, based on 1 equivalent of a phenyl group in the carbazoles, 0.1 to 10 equivalents of the aldehydes or the ketones may be used.

The polymers of Formula (2) and Formula (3) of the present invention can be obtained by condensation of carbazoles and triphenylamines with aldehydes or ketones. In the condensation reaction, the carbazoles and the triphenyl amines may be used in a molar ratio of 1:0.01 to 1:100. Based on 1 equivalent of a phenyl group in both the carbazoles and the triphenylamines, 0.1 to 10 equivalents of the aldehydes or the ketones may be used.

Examples of the carbazoles used for the production of the polymer of the present invention include carbazole, N-methylcarbazole, N-ethylcarbazole, 1,3,6,8-tetranitrocarbazole, 3,6-diaminocarbazole, 3,6-dibromo-9-ethylcarbazole, 3,6-dibromo-9-phenylcarbazole, 3,6-dibromocarbazole, 3,6- dichlorocarbazole, 3-amino-9-ethylcarbazole, 3-bromo-9-ethylcarbazole, 4,4-bis(9H-carbazol-9-yl)biphenyl, 4-glycidylcarbazole, 4-hydroxycarbazole, 9-(1H-benzotriazol-1-ylmethyl)-9H-carbazole, 9-acetyl-3,6-diiodocarbazole, 9-benzoylcarbazole, 9-benzoylcarbazole-6-dicarboxaldehyde, 9-benzylcarbazole-3-carboxaldehyde, 9-methylcarbazole, 9-phenylcarbazole, 9-vinylcarbazole, carbazole potassium, carbazole-N-carbonyl chloride, N-ethylcarbazole-3-carboxaldehyde, and N-((9-ethylcarbazol-3-yl)methylene)-2-methyl-1-indolynyl amine. These carbazoles may be used singly or in combination of two or more of them.

Examples of the aldehydes used for the production of the polymer of the present invention include saturated aliphatic aldehydes such as formaldehyde, paraformaldehyde, acetaldehyde, propylaldehyde, butyraldehyde, isobutyraldehyde, valeraldehyde, caproaldehyde, 2-methylbutyraldehyde, hexanal, undecanal, 7-methoxy-3,7-dimethyloctyl aldehyde, cyclohexanal, 3-methyl-2-butyraldehyde, glyoxal, malonaldehyde, succinaldehyde, glutaraldehyde, glutaraldehyde, adipaldehyde, and thiophenaldehyde; unsaturated aliphatic aldehydes such as acrolein and methacrolein; heterocyclic aldehydes such as furfural and pyridine aldehyde; and aromatic aldehydes such as benzaldehyde, naphthaldehyde, anthracenecarboxaldehyde, phenylbenzaldehyde, anisaldehyde, terephthalaldehyde, phenanthraldehyde, salicylaldehyde, phenylacetaldehyde, 3-phenylpropionaldehyde, tolylaldehyde, (N,N-dimethylamino)benzaldehyde, and acetoxybenzaldehyde. The aromatic aldehydes may be especially preferably used.

Examples of the ketones used for the production of the polymer of the present invention include, but are not necessarily limited to, diaryl ketones such as diphenyl ketone, phenyl naphthyl ketone, dinaphthyl ketone, phenyl tolyl ketone, ditolyl ketone, and 9-fluorenone.

Examples of the triphenylamines used for the production of the polymer of the present invention include triphenylamine and substituted triphenylamines. The substituent of the triphenylamine is exemplified by the above-described group selected from a group consisting of a halogen group, a nitro group, an amino group, a hydroxy group, a $C_{1-10}$ alkyl group, a $C_{2-10}$ alkenyl group, a $C_{6-40}$ aryl group, and a combination of them, where the alkyl group, the alkenyl group, or the aryl group may contain an ether linkage, a ketone linkage, or an ester linkage.

Examples of acid catalysis used in the condensation reaction include mineral acids such as sulfuric acid, phosphoric acid, and perchloric acid; organic sulfonic acids such as p-toluenesulfonic acid and p-toluenesulfonic acid monohydrate and carboxylic acids such as formic acid and oxalic acid. The amount of the acid catalyst is properly selected depending on the type of an acid to be used. Commonly, the amount is 0.001 to 10,000 parts by mass, preferably 0.01 to 1,000 parts by mass, and more preferably 0.1 to 100 parts by mass, based on 100 parts by mass of the carbazoles or the total of the carbazoles and the triphenylamines.

The condensation reaction is commonly carried out in a solvent, but may be carried out without any solvent. Any solvent can be used as long as the condensation reaction is not inhibited. Examples of the solvent include cyclic ethers such as tetrahydrofuran and dioxane. When the acid catalyst to be used is a liquid acid such as formic acid, such a catalyst can also serve as the solvent.

The reaction temperature during the condensation is commonly 40° C. to 200° C. The reaction time is variously selected depending on the reaction temperature, but is commonly about 30 minutes to 50 hours.

The polymer that is synthesized in the above procedure and is composed of the unit structure of Formula (1) or (2) and/or (3) commonly has a weight average molecular weight Mw of 600 to 1,000,000 or 600 to 200,000.

The polymer can be used in combination with other polymers within 30% by mass based on the total polymers.

Examples of the other polymers capable of combination include polyacrylic acid ester compounds, polymethacrylic acid ester compounds, polyacrylamide compounds, polymethacrylamide compounds, polyvinyl compounds, polystyrene compounds, polymaleimide compounds, polymaleic anhydrides, and polyacrylonitrile compounds.

Examples of material monomers of the polyacrylic acid ester compound include methyl acrylate, ethyl acrylate, isopropyl acrylate, benzyl acrylate, naphthyl acrylate, anthryl acrylate, anthrylmethyl acrylate, phenyl acrylate, 2-hydroxyethyl acrylate, 2-hydroxypropyl acrylate, 2,2,2-trifluoroethyl acrylate, 4-hydroxybutyl acrylate, isobutyl acrylate, tert-butyl acrylate, cyclohexyl acrylate, isobornyl acrylate, 2-methoxyethyl acrylate, methoxytriethylene glycol acrylate, 2-ethoxyethyl acrylate, tetrahydrofurfuryl acrylate, 3-methoxybutyl acrylate, 2-methyl-2-adamantyl acrylate, 2-ethyl-2-adamantyl acrylate, 2-propyl-2-adamantyl acrylate, 2-methoxybutyl-2-adamantyl acrylate, 8-methyl-8-tricyclodecyl acrylate, 8-ethyl-8-tricyclodecyl acrylate, and 5-acryloyloxy-6-hydroxynorbornen-2-carboxylic-6-lactone, Examples of material monomers of the polymethacrylic acid ester compound include ethyl methacrylate, n-propyl methacrylate, n-pentyl methacrylate, cyclohexyl methacrylate, benzyl methacrylate, naphthyl methacrylate, anthryl methacrylate, anthrylmethyl methacrylate, phenyl methacrylate, 2-phenylethyl methacrylate, 2-hydroxyethyl methacrylate, 2-hydroxypropyl methacrylate, 2,2,2-trifluoroethyl methacrylate, 2,2,2-trichloroethyl methacrylate, methyl acrylate, isobutyl methacrylate, 2-ethylhexyl methacrylate, isodecyl methacrylate, methacrylate, n-stearyl methacrylate, methoxydiethylene glycol methacrylate methoxypolyethylene glycol methacrylate, tetrahydrofurfuryl methacrylate isobornyl methacrylate, tert-butyl methacrylate, isostearyl methacrylate, n-butoxyethyl methacrylate, 3-chloro-2-hydroxypropyl methacrylate, 2-methyl-2-adamantyl methacrylate, 2-ethyl-2-adamantyl methacrylate, 2-propyl-2-adamantyl methacrylate, 2-methoxybutyl-2-adamantyl methacrylate, 8-methyl-8-tricyclodecyl methacrylate, 8-ethyl-8-tricyclcodecyl methacrylate, 5-methacryloyloxy-6-hydroxynorbornen-2-carboxylic-6-lactone, and 2,2,3,3,4,4,4-heptafluorobutyl methacrylate.

Examples of the acrylamide compound include acrylamide, N-methylacrylamide, N-ethylacrylamide, N-benzylacrylamide, N-phenylacrylamide, and N,N-dimethylacrylamide.

Examples of material monomers of the polymethacrylic acid amide compound include methacrylamide, N-methylmethacrylamide, N-ethylmethacrylamide, N-benzylmethacrylamide, N-phenylmethacrylamide, and N,N-dimethylmethacrylamide.

Examples of material monomers of the polyvinyl compound include vinyl ether, methyl vinyl ether, benzyl vinyl ether, 2-hydroxyethyl vinyl ether phenyl vinyl ether, and propyl vinyl ether.

Examples of material monomers of the polystyrene compound include styrene, methylstyrene, chlorostyrene, bromostyrene, and hydroxystyrene.

Examples of material monomers of the polymaleimide compound include maleimide, N-methylmaleimide, N-phenylmaleimide, and N-cyclohexylmaleimide.

These polymers can be produced by dissolving an addition polymerizable monomer and, as necessary, a chain transfer agent in an organic solvent, then adding a polymerization initiator to perform polymerization reaction, and adding a polymerization terminator to terminate the polymerization reaction. The chain transfer agent is added, for example, in an amount of 10% or less with respect to the monomer mass, the polymerization initiator is added, for example, in an amount of 1 to 10% with respect to the monomer mass, and the polymerization terminator is added, for example, in an amount of 0.01 to 0.2% by mass with respect to the monomer mass.

Examples of the organic solvent include propylene glycol monomethyl ether, propylene glycol monopropyl ether, ethyl lactate, cyclohexanone, methyl ethyl ketone, and dimethylformamide.

Examples of the chain transfer agent include dodecanethiol and dodecylthiol.

Examples of the polymerization initiator include azobisisobutyronitrile and azobiscyclohexanecarbonitrile.

Examples of the polymerization terminator include 4-methoxyphenol.

The reaction temperature of the polymerization reaction is properly selected from 30 to 100° C., and the reaction time is properly selected from 1 to 48 hours.

<Resist Underlayer Film Forming Composition>

The present invention relates to a resist underlayer film forming composition including the polymer containing the unit structure of Formula (1) or the polymer containing the unit structure of Formula (2) and/or Formula (3).

In the present invention, the resist underlayer film forming composition includes the polymer and a solvent. The resist underlayer film forming composition may further include a cross-linking agent, an acid, and, as necessary, additives such as an acid generator and a surfactant.

The composition includes a solid content in a ratio of 0.1 to 70% by mass or 0.1 to 60% by mass with respect to the total mass of the composition. The solid content means components that are all components of the resist underlayer film forming composition except for the solvent component. The solid content may contain the polymer in a ratio of 1 to 100% by mass, 1 to 99.9% by mass, or 50 to 99.9% by mass.

Examples of the cross-linking agent include melamine agents, substituted urea agents, and polymers of them. Preferred cross-linking agents include at least two cross-linkable substituents, and examples of the agent include compounds such as methoxymethylated glycoluril, butoxymethylated glycoluril, methoxymethylated melamine, butoxymethylated melamine, methoxymethylated benzoguanamine, butoxymethylated benzoguanamine, methoxymethylated urea, butoxymethylated urea, methoxymethylated thiourea, and methoxymethylated thiourea. Condensed products of them may also be used.

As the cross-linking agent, a cross-linking agent having high heat resistance may be used. As the cross-linking agent having high heat resistance, a compound including a cross-linkable substituent having an aromatic ring such as a benzene ring and a naphthalene ring in the molecule may be preferably used. Examples of the compound include compounds having a partial structure of Formula (4) and polymers or oligomers having a unit structure of Formula (5).

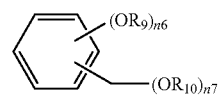

Formula (4)

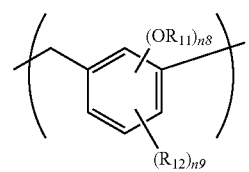

Formula (5)

In Formula (4), each of $R_9$ and $R_{10}$ is a hydrogen atom, a $C_{1-10}$ alkyl group, or a $C_{6-20}$ aryl group, n6 is an integer of 1 to 4, n7 is an integer of 1 to (5−n6), and (n9+n10) is an integer of 2 to 5.

In Formula (5), $R_{11}$ is a hydrogen atom or a $C_{1-10}$ alkyl group, $R_{12}$ is a $C_{1-10}$ alkyl group, n11 is an integer of 1 to 4, n12 is 0 to (4−n11), and (n11+n12) is an integer of 1 to 4.

In the polymer or oligomer having the unit structure of Formula (5), the number of repetitions is preferably in a range of 2 to 100 or 2 to 50.

The alkyl group and the aryl group of $R_9$ to $R_{11}$ are exemplified by the alkyl groups and the aryl groups above.

The compound of Formula (4) and the polymer and oligomer of Formula (5) are exemplified below.

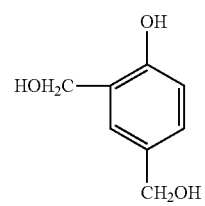

Formula (4-1)

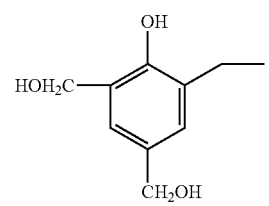

Formula (4-2)

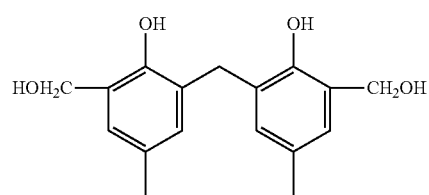

Formula (4-3)

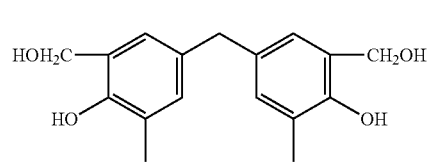

Formula (4-4)

-continued
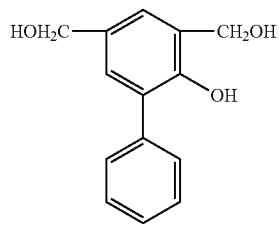
Formula (4-5)
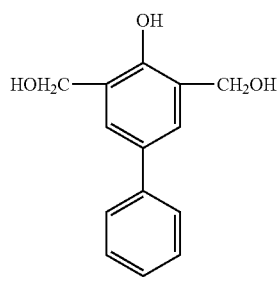
Formula (4-6)
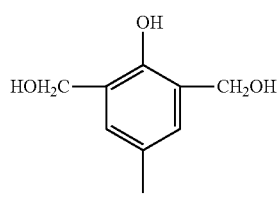
Formula (4-7)
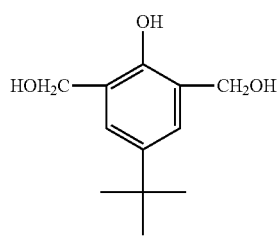
Formula (4-8)
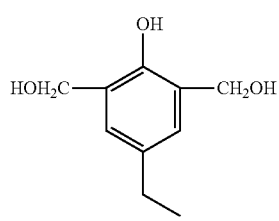
Formula (4-9)
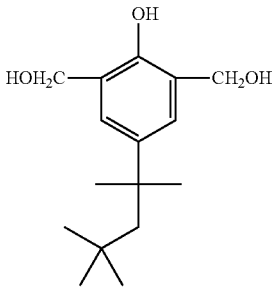
Formula (4-10)
-continued
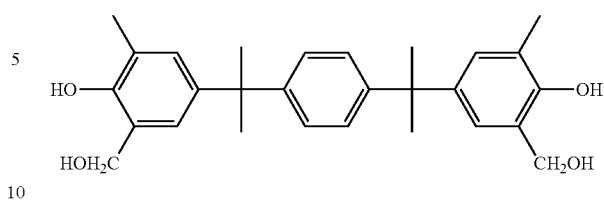
Formula (4-11)
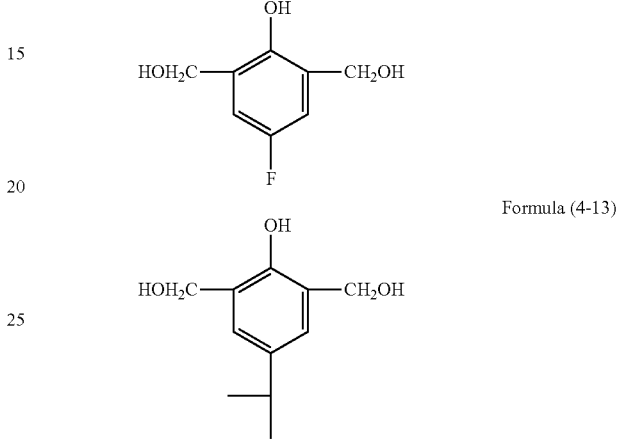
Formula (4-12)
Formula (4-13)
Formula (4-14)
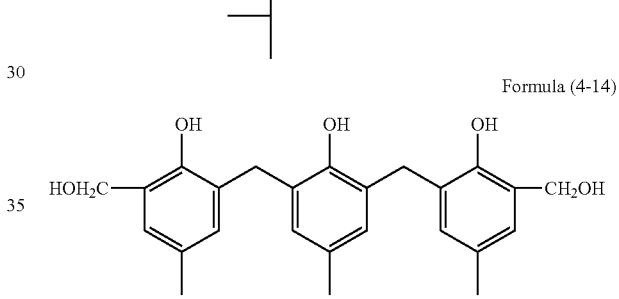
Formula (4-15)
Formula (4-16)
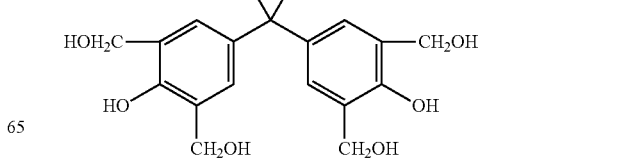
Formula (4-17)

-continued

Formula (4-18)
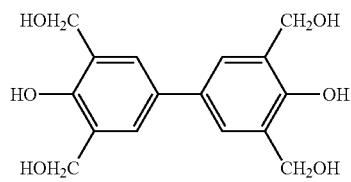

Formula (4-19)
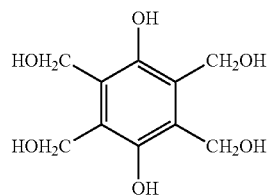

Formula (4-20)
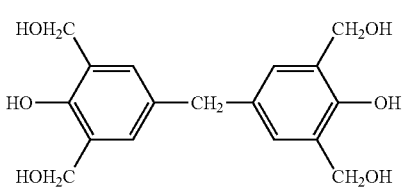

Formula (4-21)
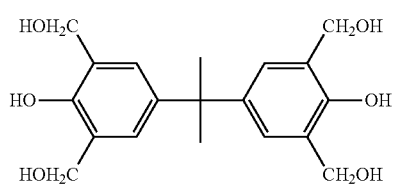

Formula (4-22)
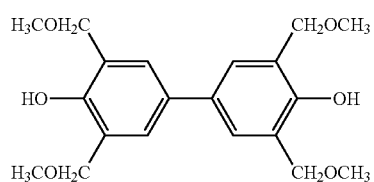

Formula (4-23)
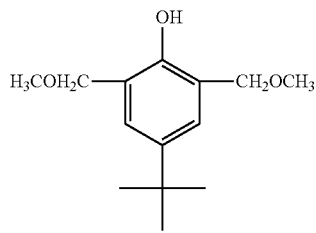

Formula (4-24)
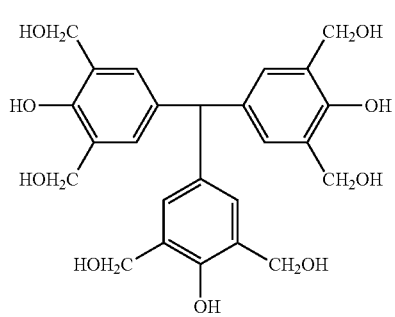

-continued

Formula (4-25)
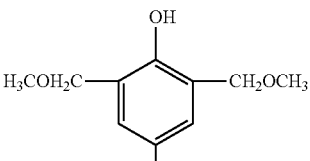

Formula (4-26)
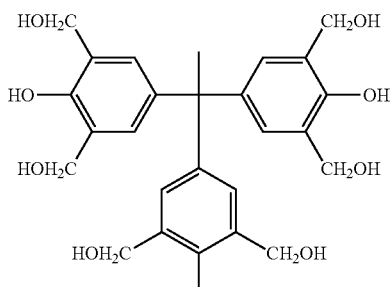

Formula (4-27)
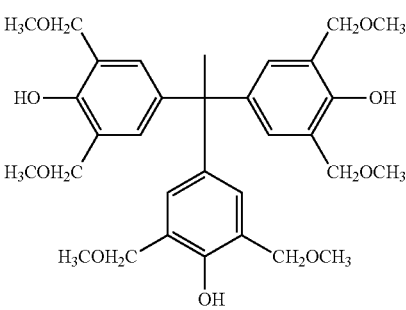

These compounds are available as the products of Asahi Organic Chemicals Industry Co Ltd. and Honshu Chemical Industry Co., Ltd. For example, the compound of Formula (4-21) in the cross-linking agents above is available as a trade name of TM-BIP-A from Asahi Organic Chemicals Industry Co., Ltd.

In the resist underlayer film forming composition of the present invention, the combination amount of the cross-linking agent is properly determined depending on, for example, a solvent for applying the composition, an underlying substrate on which the composition is applied, a solution viscosity required for the composition, and a film shape required for a film that is formed from the composition. For example, the combination amount is 0.001 to 80% by mass, preferably 0.01 to 50% by mass, and more preferably 0.05 to 40% by mass, with respect to the total solid contents. Such a cross-linking agent may cause cross-linking reaction by self-condensation, but when the polymer of the present invention includes cross-linking substituents, the cross-linking agent can cause the cross-linking reaction with the cross-linking substituents.

The resist underlayer film forming composition of the present invention may include an acid, a thermal acid generator, or a photo-acid generator as a catalyst for accelerating the cross-linking reaction.

The thermal generator is a compound that generates an acid by heat. Examples of the generator include thermal acid generators that generate, by heat, acidic compounds such as p-toluenesulfonic acid, trifluoromethanesulfonic acid, pyridinium p-toluenesulfonate, salicylic acid, sulfosalicylic acid, citric acid, benzoic acid, hydroxybenzoic acid, and naphthalene carboxylic acid and/or acids such as 2,4,4,6-tetrabromocyclohexadienone, benzoin tosylate, 2-nitrobenzyl tosylate, and other organic sulfonic acid alkyl esters.

The thermal acid generator is mixed in an amount of 0.0001 to 20% by mass, preferably 0.0005 to 10% by mass, and preferably 0.01 to 3% by mass, with respect to the total solid contents of the resist underlayer film forming, composition.

A photo-acid generator can be further added to the underlayer film forming composition of the present invention in order to match the acidity to that of a resist coated as the upper layer of a resist underlayer film that is formed from the underlayer film forming composition in a lithography process.

Preferred examples of the photo-acid generator include onium salt photo-acid generators such as bis(4-t-butylphenyl) iodonium trifluoromethanesulfonate and triphenylsulfonium trifluoromethanesulfonate; halogen-containing compound photo-acid generators such as phenyl-bis(trichloromethyl)-s-triazine; and sulfonic acid photo-acid generators such as benzoin tosylate and N-hydroxysuccinimide trifluoromethanesulfonate.

The photo-acid generator is mixed in an amount of 0.2 to 10% by mass and preferably 0.4 to 5% by mass with respect to the total solid contents of the resist underlayer film forming composition.

A light absorber, a rheology control agent, an adhesion assistant, a surfactant, and the like in addition to the agents above, as necessary, can be further added to the resist underlayer film forming composition of the present invention.

Examples of the light absorber include commercially available light absorbers described in "Kogyo-yo Shikiso no Gijutsu to Shijo (Technology and Market of Industrial Dyes)" (CMC Publishing Co., Ltd.) or "Senryo Binran (Handbook for Dyes)" (edited by The Society of Synthetic Organic Chemistry, Japan). For example, C.I. Disperse Yellow 1, 3, 4, 5, 7, 8, 13, 23, 31, 49, 50, 51, 54, 60, 64, 66, 68, 79, 82, 88, 90, 93, 102, 114, and 124; C.I. Disperse Orange 1, 5, 13, 25, 29, 30, 31, 44, 57, 72, and 73; C.I. Disperse Red 1, 5, 7, 13, 17, 19, 43, 50, 54, 58, 65, 72, 73, 88, 117, 137, 143, 199, and 210; C.I. Disperse Violet 43; C.I. Disperse Blue 96; C.I. Fluorescent Brightening Agent 112, 135, and 163, C.I. Solvent Orange 2 and 45; C.I. Solvent Red 1, 3, 8, 23, 24, 25, 27, and 49; C.I. Pigment Green 10; and C.I. Pigment Brown 2 may be suitably used.

The light absorber is commonly mixed in a ratio of 10% by mass or less and preferably 5% by mass or less with respect to the total solid contents of the resist underlayer film forming composition.

The rheology control agent is added mainly in order to improve flowability of the resist underlayer film forming composition, and especially in it baking process, in order to improve film thickness uniformity of the resist underlayer film or to increase packing performance of the resist underlayer film forming composition into holes of a substrate.

Examples of the rheology control agent include phthalic acid derivatives such as dimethyl phthalate, diethyl phthalate, diisobutyl phthalate, dihexyl phthalate, and butyl isodecyl phthalate; adipic acid derivatives such as di-n-butyl adipate, diisobutyl adipate, diisooctyl adipate, and octyl decyl adipate; maleic acid derivatives such as di-n-butyl maleate, diethyl maleate, and dinonyl maleate; oleic acid derivatives such as methyl oleate, butyl oleate, and tetrahydrofurfuryl oleate; and stearic acid derivatives such as n-butyl stearate and glyceryl stearate. Such a rheology control agent is commonly mixed in a ratio of less than 30% by mass with respect to the total solid contents of the resist underlayer film forming composition.

The adhesion assistant is added mainly in order to improve adhesiveness between a substrate or a resist and the resist underlayer film forming composition, and especially in a developing process, in order not to release the resist. Specific examples of the adhesion assistant include chlorosilanes such as trimethylchlorosilane, dimethylvinylchlorosilane, methyldiphenylchlorosilane, and chloromethyldimethylchlorosilane; alkoxysilanes such as trimethylmethoxysilane, dimethyldiethoxysilane, methyldimethoxysilane, dimethylvinylethoxysilane, diphenyldimethoxysilane, and phenyltriethoxysilane; silazanes such as hexamethyldisilazane, N,N'-bis(trimethylsilyl)urea, dimethyl trimethylsilylamine, and trimethylsilylimidazole; silanes such as vinyltrichlorosilane, γ-chloropropyltrimethoxysilane, γ-aminopropyltriethoxysilane, and γ-glycidoxypropyltrimethoxysilane; heterocyclic compounds such as benzotriazole, benzimidazole, indazole, imidazole, 2-mercaptobenzimidazole, 2-mercaptobenzothiazole, 2-mercaptobenzoxazole, urazole, thiouracil, mercaptoimidazole, and mercaptopyrimidine; ureas such as 1,1-dimethylurea and 1,3-dimethylurea; and thiourea compounds.

Such an adhesion assistant is commonly mixed in as ratio of less than 5% by mass and preferably less than 2% by mass with respect to the total solid contents of the resist underlayer film forming composition.

A surfactant can be mixed to the resist underlayer film forming composition of the present invention in order not to generate pinholes and stration and in order to further improve coating properties against surface irregularity of a substrate.

Examples of the surfactant include nonionic surfactants including polyoxyethylene alkyl ethers such as polyoxyethylene lauryl ether, polyoxyethylene stearyl ether, polyoxyethylene cetyl ether, and polyoxyethylene oleyl ether; polyoxyethylene alkylallyl ethers such as polyoxyethylene octylphenol ether and polyoxyethylene nonylphenol ether; polyoxyethylene-polyoxypropylene block copolymers; sorbitan fatty acid esters such as sorbitan monolaurate, sorbitan monopalmitate, sorbitan monostearate, sorbitan monooleate, sorbitan trioleate, and sorbitan tristearate; and polyoxyethylene sorbitan fatty acid esters such as polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate; fluorochemical surfactants including EFTOP EF301, EF303, EF352 (manufactured by Tochem Products Co., Ltd., trade names), MEGAFAC F-171, F-173, R-30 (manufactured by Dainippon Ink and Chemicals, Inc., trade names), Fluorad FC-430, FC-431 (manufactured by Sumitomo 3M Ltd., trade names), Asahiguard AG-710, Surflon S-382, SC-101, SC-102, SC-103, SC-104, SC-105, SC-106 (manufactured by Asahi Glass Co., Ltd., trade names); and organosiloxane polymer KP-341 (manufactured by Shin-Etsu Chemical Co., Ltd.).

Such a surfactant is commonly mixed in an amount of 2.0% by mass or less and preferably 1.0% by mass or less with respect to the total solid contents of the resist underlayer film forming composition of the present invention. These surfactants may be added singly or in combination of two or more of them.

In the present invention, the polymer, the cross-linking agent component, and the additives such as a cross-linking catalyst may be dissolved in a solvent to be added. Examples of the solvent dissolving the additives include ethylene glycol monomethyl ether, ethylene glycol monoethyl ether, ethylene glycol monobutyl ether, ethylene glycol monoisopropyl ether, ethylene glycol methyl ether acetate, ethylene glycol ethyl ether acetate, methyl cellosolve acetate, ethyl cellosolve acetate, diethylene glycol, diethylene glycol monomethyl ether, diethylene glycol monoethyl ether, diethylene glycol dimethyl ether, diethylene glycol diethyl ether, diethylene glycol monoethyl ether acetate, propylene glycol, propylene glycol monomethyl ether, propylene glycol monobutyl ether, propylene glycol monomethyl ether acetate, propylene glycol monoethyl ether, propylene glycol monoethyl ether acetate, propylene glycol monobutyl ether acetate, propylene glycol propyl ether acetate, dipropylene glycol monomethyl ether, dipropylene glycol monoethyl ether, triethylene glycol dimethyl ether, toluene, xylene, styrene, methyl ethyl ketone, cyclopentanone, cyclohexanone, ethyl 2-hydroxypropionate, ethyl 2-hydroxy-2-methylpropionate, ethyl ethoxyacetate, ethyl hydroxyacetate, methyl 2-hydroxy-3-methylbutanoate, methyl 3-methoxypropionate, ethyl 3-methoxypropionate, ethyl 3-ethoxypropionate, methyl 3-ethoxypropionate, methyl pyruvate, ethyl pyruvate, ethyl acetate, butyl acetate, ethyl lactate, butyl lactate, 1-octanol, ethylene glycol, hexylene glycol, trimethylene glycol, 1-methoxy-2-butanol, cyclohexanol, diacetone alcohol, furfuryl alcohol, tetrahydrofurfuryl alcohol, propylene glycol, benzyl alcohol, 1,3-butanediol, 1,4-butanediol, 2,3-butanediol, γ-butyl lactone, acetone, methyl isopropyl ketone, diethyl ketone, methyl isobutyl ketone, methyl n-butyl ketone, acetic isopropyl ketone; n-propyl acetate, isobutyl acetate, methanol, ethanol, isopropanol, tert-butanol, allyl alcohol, n-propanol, 2-methyl-2-butanol, isobutanol, n-butanol, 2-methyl-1-butanol, 1-pentanol, 2-methyl-1-pentanol, 2-ethylhexanol, 1-octanol, ethylene glycol, hexylene glycol, trimethylene 1-methoxy-2-butanol, diacetone alcohol, furfuryl alcohol, tetrahydrofurfuryl alcohol, propylene glycol, benzyl alcohol, isopropyl ether, 1,4-dioxane, N,N-dimethylformamide, N,N-dimethylacetamide, N-methylpyrrolidone, 1,3-dimethyl-2-imidazolidinone, dimethyl sulfoxide, and N-cyclohexyl-2-pyrrolidinone. These organic solvents may be used singly or in combination of two or more of them.

Among these solvents, propylene glycol monomethyl ether, propylene glycol monomethyl ether acetate, ethyl lactate, butyl lactate, cyclohexanone, and the like are preferably used in order to improve leveling properties.

<Resist Underlayer Film>

From the resist underlayer film forming composition of the present invention, a resist underlayer film used for a lithography process in the production of semiconductor devices can be formed.

The resist underlayer film of the present invention can be formed by applying the resist underlayer film forming composition of the present invention on a substrate (for example, a transparent substrate such as a silicon/silicon dioxide coat, a glass substrate, and an ITO substrate) used for the production of precision integrated circuit devices by an appropriate coating means such as a spinner and a coater and by baking the composition to be cured.

The film thickness of the resist underlayer film formed on a substrate can be properly adjusted, but is preferably, for example, 0.01 to 3.0 µm. The baking condition after applying the resist underlayer film is arbitrarily determined as long as the performance as the resist underlayer film is not impaired, and is, for example, at 80 to 350° C. for 0.5 to 120 minutes.

The resist underlayer film of the present invention has a similar selection ratio of dry etching rate to that of a resist or a smaller selection ratio of dry etching rate than that of a resist or a substrate unlike a conventional resist underlayer film having a high etching rate.

Furthermore, in the resist underlayer film oldie present invention, a polymer includes a light absorption moiety such as a carbazole skeleton, a benzene ring, and a fluorene ring having sufficiently large light absorbability. Hence, in the lithography process, the resist underlayer film has characteristics as an anti-reflective coating to absorb reflections of light or electron beams from a substrate. Furthermore, the polymer includes the light absorption moiety, and thus the resist underlayer film has an advantage that no light absorber is dispersed into a resist film and the like during, for example, drying a resist by heat unlike a conventional resist underlayer film forming composition mixed with a light absorber.

The resist underlayer film of the present invention has higher thermal stability than that of a conventional resist underlayer film because the polymer includes a carbazole skeleton, a benzene ring, a fluorene ring, and the like. This can suppress the generation of degradation products during baking, and an upper layer film is unlikely to be contaminated by the degradation products. Thus, the baking process can have a larger temperature margin. Furthermore, the resist underlayer film has a sufficient function as a hard mask because it has high heat resistance.

The resist underlayer film of the present invention can also be used as a suppression film having a function to suppress the interaction between a substrate and a resist or to suppress adverse effects on a substrate by a resist forming composition or a substance generated during exposure to a resist.

<Method for Forming Resist Pattern>

In the lithography process, the use of the resist film of the present invention can lead to the formation of a fine resist pattern.

The method for forming a resist pattern of the present invention will be described below. First, a resist underlayer film is prepared on a substrate as described above. Next, a resist forming composition is applied on the resist underlayer film directly or, as necessary, on a film that is obtained by applying one to several layers of coating materials on the resist underlayer film followed by curing, and then the composition is cured. The formed resist is irradiated with light or electron beams through a predetermined mask with a pattern followed by development, then rinsed, and dried to give a good resist pattern. As necessary, post exposure bake (PEB) may be performed after the exposure to light or electron beams. Next, the patterned resist is used as a mask for dry etching to remove the resist underlayer film, and consequently a desired pattern is transferred onto the substrate.

The resist used in the present invention is a photoresist or an electron beam resist.

In the present invention, the photoresist applied on the resist underlayer film may be a negative resist or a positive resist. Examples of the resist include a positive photoresist composed of a novolak resin and 1,2-naphthoquinone divide sulfonic acid ester, a chemically amplified photoresist composed of a photo-acid generator and a binder having a group that is degraded by acid to increase an alkali dissolution rate, a chemically amplified photoresist composed of an alkali soluble binder, a low molecular compound that is degraded by acid to increase the alkali dissolution rate of a photoresist, and a photo-acid generator, a chemically amplified photoresist composed of a binder having to group that is degraded by acid to increase an alkali dissolution rate, a low molecular compound that is degraded by acid to increase the alkali dissolution rate of a photoresist, and a photo-acid generator, and a photoresist including a skeleton having an Si atom. Examples of a chemically amplified resist composed of an acid generator and a polyvinyl phenol resin protected by t-BOC include a trade name of APEX-E manufactured by Rohm and Haas Company.

Examples of the electron beam resist applied on the resist underlayer film in the present invention include a composition composed of a resin that includes an Si—Si bond in a main chain and includes an aromatic ring at the end and of an acid generator that generates an acid by irradiation with electron beams, and a composition composed of poly(p-hydroxystyrene) that has a hydroxy group substituted with an organic group containing N-carboxyamine and of an acid generator that generates an acid by irradiation with electron beams. In the latter electron beam resist composition, during an electron beam lithography process, an acid that is generated from the acid generator by the irradiation with electron beams is reacted with the N-carboxyaminoxy group on a side chain of the polymer, then the polymer side chain is degraded to form a hydroxy group, and consequently the polymer is led to be alkali soluble. Thus, an area exposed to electron beams is dissolved in an alkali developer to form a resist pattern.

Examples of the acid generator that generates an acid by the irradiation with electron beams include halogenated organic compounds such as 1,1-bis[p-chlorophenyl]-2,2,2-trichloroethane, 1,1-bis[p-methoxyphenyl]-2,2,2-trichloroethane, 1,1-bis[p-chlorophenyl]-2,2-dichloroethane, and 2-chloro-6-(trichloromethyl)pyridine; onium salts such as a triphenyl sulfonium salt and a diphenyl iodonium salt; and sulfonic acid esters such as nitrobenzyl tosylate and dinitrobenzyl tosylate.

Usable examples of the developer for a resist that is formed on the resist underlayer film of the present invention include aqueous solutions of alkalis including inorganic alkalis such as sodium hydroxide, potassium hydroxide, sodium carbonate, sodium silicate, sodium metasilicate, and aqueous ammonia; primary amines such as ethylamine and n-propylamine; secondary amines such as diethylamine and di-n-butylamine; tertiary amines such as triethylamine and methyldiethylamine; alcohol amines such as dimethylethanolamine and triethanolamine; quaternary ammonium salts such as tetramethylammonium hydroxide, tetraethylammonium hydroxide, and choline, and cyclic amines such as pyrrole and piperidine. An alcohol such as isopropyl alcohol or a surfactant such as a nonionic surfactant can be added to such an aqueous alkali solution in a suitable amount for use. Among these developers, the quaternary ammonium salts are preferred, and tetramethylammonium hydroxide and choline are more preferred.

The exposure light to the photoresist is actinic rays such as near-ultraviolet rays, far-ultraviolet rays, and extreme-ultraviolet rays (for example, EUV a wavelength of 13.5 nm). Usable examples include rays having a wavelength of 248 nm (KrF laser beam), 193 nm (ArF laser beam), and 157 nm ($F_2$ laser beam). Photoirradiation may employ any method without limitation as long as an acid can be generated from a photo-acid generator, and for example, the exposure amount is 1 to 2000 $mJ/cm^2$, 10 to 1500 $mJ/cm^2$, or 50 to 1000 $mJ/cm^2$.

In the electron beam resist process, the electron beam irradiation may be carried out, for example, using an electron beam irradiation device.

The resist underlayer film of the present invention does not cause intermixing with a resist forming composition and thus has advantages as a planarizing film and a bottom anti-reflective coating. Thus, a resist formed on the resist underlayer film of the present invention can form a fine resist pattern that does not cause pattern collapse and the like.

Furthermore, in the resist pattern forming method of the present invention, the resist underlayer film of the present invention has a similar selection ratio of dry etching rate to that of a resist, and thus dry etching of the resist underlayer film may employ a method that achieves smaller pattern widths of a resist pattern and a resist underlayer film than that by resist development. Hence, a fine resist pattern can be obtained.

<Method for Producing Semiconductor Device>

Next, the production method of to semiconductor device using the resist underlayer film forming composition above will be described.

Commonly, a semiconductor device can be produced by forming a resist underlayer film from a resist underlayer film forming composition on a semiconductor substrate, forming a resist film on the resist underlayer film, forming a resist pattern on the resist film by application of light or electron beams using, a mask with a pattern followed by development, etching the resist underlayer film according to the resist pattern, and fabricating the semiconductor substrate using, the patterned resist underlayer film.

In recent years, in the production method of a semiconductor device, in order to suppress the collapse of a resist pattern after development due to a finer resist pattern, a resist has had a smaller thickness. A lithography process using such a thin resist employs a method in which a resist pattern is transferred onto an underlayer film in an etching, process and a substrate is fabricated, using the underlayer film or a method in which a resist pattern is transferred onto an underlayer film by an etching process, then the pattern transferred onto the underlayer film is further transferred onto a further underlayer film by an etching process that uses a gas having different compositions, and the processes are repeated to complete the fabrication of a substrate.

In the production method of a semiconductor device of the present invention, a film having various functions may be formed between the resist film and the resist underlayer film. Thus, even when a thin resist film is formed in order to obtain a fine pattern, proper selection of an etching gas achieves easy fabrication of a substrate without pattern collapse.

Examples of the film formed on the resist underlayer film include a coating that is obtained by applying, a coating material containing an organic polymer or an inorganic polymer and a solvent followed by curing, and a hard mask that is obtained by deposition of an inorganic substance such as silicon oxynitride. The resist underlayer film of the present invention has heat resistance, and thus an inorganic substance can be deposited on the resist underlayer film.

The gas used for the etching: process may be a gas used in a conventional process and is properly selected depending on a layer to be etched or a substrate. Usable examples of the gas include a hydrogen-containing gas, an oxygen-containing gas, and a halogen-containing gas.

Namely, the semiconductor device of the present invention can be produced through forming as resist underlayer film from the resist underlayer film forming composition of the present invention on a semiconductor substrate, forming a resist film on the resist underlayer film, forming a resist pattern on the resist film by application of light or electron beams using a mask with a pattern followed by development, etching the resist underlayer film by an oxygen-containing gas or a hydrogen-containing gas according to the resist pattern, and fabricating the semiconductor substrate by a halogen-containing gas using the patterned resist underlayer film.

The semiconductor device of the present invention can also be produced through forming a resist underlayer film from the resist underlayer film forming composition of the present invention on a semiconductor substrate, forming a hard mask on the resist underlayer film from a coating material containing a silicon component and the like or forming a hard mask (for example, a silicon oxynitride mask) by deposition, further forming a resist film on the hard mask, forming a resist pattern on the resist film by application of light or electron beams using as mask with a pattern followed by development, etching the hard mask by a halogen-containing gas according, to the resist pattern, etching the resist underlayer film by an oxygen-containing gas or a hydrogen-containing gas according to the patterned hard mask, and fabricating the semiconductor substrate by a halogen-containing gas using the patterned resist underlayer film.

The present invention can provide, as another application in addition to the resist underlayer film, a high refractive index film that includes a polymer containing a carbazole ring or a carbazole ring and a triphenylamine ring and that can achieve high heat resistance, high transparency, high refractive index, and high solubility by itself without using any metal oxide.

Namely, the present invention relates to a high refractive index film forming composition that includes a polymer including at least one unit structure selected from a group consisting of the unit structure of Formula (1), the unit structure of Formula (2), and the unit structure of Formula (3), namely, a carbazole novolak resin, a high refractive index film formed form the composition, and an electronic device including the high refractive index film. The present invention will be described below.

<High Refractive Index Film Forming Composition>

In the present invention, the high refractive index film forming composition includes the polymer and a solvent. The composition may further include other components such as the cross-linking agent, the acid generator, the surfactant, and the leveling agent above as long as the effect as a high refractive index film is not impaired.

For the polymer, the definitions of the substituents in the polymer containing the unit structure of Formula (1) and in the polymer containing the unit structure of Formula (2) and/or Formula (3) are exemplified above.

Among them, the heterocyclic group included in the polymer used for the high refractive index film forming composition of the present invention is preferably a heterocyclic group containing a sulfur atom.

The solid concentration of the high refractive index film forming composition is not specifically limited as long as storage stability is not affected, and can be properly designed depending on the thickness of an intended film. From the viewpoints of the solubility and the storage stability, the solid concentration is preferably 0.1 to 50% by mass and more preferably 0.1 to 20% by mass. The solvent can be exemplified by the solvents above.

The solid content may include the polymer in a ratio of 1 to 100% by mass, to 99.9% by mass, or 50 to 99.9% by mass.

The polymer included in the high refractive index film forming composition of the present invention is, for example, a highly branched polymer or a linear polymer having a weight average molecular weight of 1,000 to 2,000,000.

The polymer of the present invention is a compound having a high molecular weight but has excellent handling properties because a solution of the polymer in a solvent has low viscosity.

The high refractive index film forming composition may further include a thermoplastic resin containing other polymers or a thermoplastic resin composition of the resin in addition to the polymer containing the unit structures of Formulae (1), (2), and (3).

Specific examples of the polymer include, but are not necessarily limited to, a polyethylene resin, a polypropylene resin, a polystyrene resin, an acrylonitrile/butadiene/styrene (ABS) resin, a polycarbonate resin, a polyethylene terephthalate resin, a polyamide resin, a polyimide resin, a (meth) acrylic resin, an polyester resin (including polyethylene terephthalate), a polynorbornene resin, a polylactic acid resin, a polyurethane resin, a polyether resin, a polyethersulfone resin, a polyetherketone resin, as polythioether resin, a phenol resin, an urea resin, as melamine resin, an unsaturated polyester resin, and an epoxy resin. The resin is preferably used in a range of 1 to 10,000 parts by mass and more preferably in a range of 1 to 1,000 parts by mass based on 100 parts by mass of the polymer.

For example, in the case of a composition with a (meth) acrylic resin, a (meth)acrylate compound is mixed with the polymer, and the (meth)acrylate compound is polymerized to give the composition.

Examples of the (meth)acrylate compound include methyl (meth)acrylate, ethyl(meth)acrylate, ethylene glycol di(meth)acrylate, tetraethylene glycol di(meth)acrylate, polyethylene glycol di(meth)acrylate, propylene glycol di(meth)acrylate, polypropylene glycol di(meth)acrylate, 1,4-butanediol di(meth)acrylate, 1,6-hexanediol di(meth) acrylate, neopentyl glycol di(meth))acrylate, trimethylolpropane trioxyethyl(meth)acrylate, tricyclodecane dimethanol di(meth)acrylate, tricyclodecanyl di(meth)acrylate, trimethylolpropane trioxypropyl(meth)acrylate, tris-2-hydroxyethyl isocyanurate tri(meth)acrylate, tris-2-hydroxyethyl isocyanurate di(meth)acrylate, 1,9-nonanediol di(meth) acrylate, pentaerythritol di(meth)acrylate, glycerin methacrylate acrylate, pentaerythritol tri(meth)acrylate, trimethylolpropane trimethacrylate, (meth)acrylic acid allyl, (meth)acrylic acid vinyl, epoxy(meth)acrylate, polyester (meth)acrylate, and urethane(meth)acrylate.

Such a (meth)acrylate compound can be polymerized in the presence of as photo radical initiator or a thermal radical initiator by photoirradiation or heat. Examples of the photo radical polymerization initiator include acetophenones, benzophenones, Michler's benzoyl benzoate, an amyloxim ester, tetramethylthiuram monosulfide, and thioxanthones.

In particular, a photafragmentation type photo radical polymerization initiator is preferred. The photofragmentation type photo radical polymerization initiator is described in Saishin UV Koka Gijutsu (Latest UV Curing Technologies) (page 159, published by Kazuhiro Takausu, Technical Information Institute Co., Ltd., 1991).

Examples of commercially available photo radical polymerization initiators include trade names: Irgacure 184, 369, 651, 500, 819, 907, 784, 2959, CGI-1700, CGI-1750, CGI-1850, CG24-61, Darocur 1116, 1173 manufactured by Ciba Japan, trade name: Lucirin TPO manufactured by BASF, trade name: Ubecryl P 36 manufactured by UCB, and trade name: Esacure KIP 150, KIP 65 LT, KIP 100 F, KT 37, KT 55, KTO 46, KIP 7543 manufactured by Fratelli Lamberti.

The photopolymerization initiator is preferably used in a range of 0.1 to 15 parts by mass and more preferably in a range of 1 to 10 parts by mass based on 100 parts by mass of a (meth)acrylate compound.

A solvent used for the polymerization ma be the solvents described in the film forming composition.

<High Refractive Index Film>

The high refractive index forming composition of the present invention is applied on a substrate and the like followed by curing to give a high refractive index film.

The high refractive index film oldie present invention includes a polymer that includes a novolak unit structure containing a carbazole ring or a carbazole ring and a triphenylamine ring, and thus has extremely high heat resistance and does not cause heat deterioration by depositing of a deposition.

The high refractive index film of the present invention can maintain high heat resistance and high transparency. Even when a monomer unit that has been considered to impair heat resistance and transparency is used, a simple change of a polymer skeleton to the partial structure of the present invention may control physical properties. Namely, the high refractive index film of the present invention can control various physical properties by the change of a monomer type as the starting material for synthesis of an included polymer.

For example, the polymer containing a carbazole ring or the polymer containing a carbazole ring and a triphenylamine ring of the present invention can be used as an insulating, material having high heat resistance.

In addition, the high refractive index film of the present invention includes no metal oxide and achieves high refractive index from the polymer alone. Hence, even through as dry process such as etching and ashing, an etching rate is constant to give a coating film having a uniform film thickness, and a process margin for the production of devices is enlarged.

The high refractive index film of the present invention having characteristics such as high heat resistance, high transparency, high refractive index, high solubility, and low volume contraction as described-above can be suitably used as an optical member for the production of electronic devices such as a liquid crystal display, an organic electroluminescence (EL) display, an optical semiconductor (LED) device, a solid image sensing device, an organic thin film solar cell, a dye-sensitized solar cell, and an organic thin film transistor (TFT).

EXAMPLES

Hereinafter, the present invention will be described, in further detail based on Examples and Comparative Examples, but the present invention is not limited to Examples.
Measuring Equipment
[$^1$H NMR]
  Apparatus: JEOL-ECP300 (300 MHz)
  Measurement solvent: $CDCl_3$, $DMSO-d_6$
  Standard substance: tetramethylsilane (TMS) (δ0.0 ppm).
[Weight Average Molecular Weight]
  Apparatus: HLC-8200 GPC manufactured by Tosoh Corporation
  Column: Shodex KF-804 L+KF-805 L
  Column temperature: 40° C.
  Solvent: tetrahydrofuran
  Detector: UV (254 nm)
  Calibration curve: standard polystyrene
[5% Weight Loss Temperature]
  Apparatus: TG-8120 manufactured by Rigaku Corp.
  Temperature increase rate: 10° C./minute
  Measurement temperature: 25° C.-750° C.
[Glass Transition Temperature]
  Apparatus: Photo-DSC 204 F1 Phoenix manufactured by NETZSCH
  Temperature increase rate: 40° C./minute
  Measurement temperature: 25° C.-350° C.
[Refractive Index, Film Thickness]
  Apparatus: variable angle spectroscopic ellipsometer VASE manufactured by J.A. Woollam JAPAN Co., Inc.
[Light Transmittance]
  Apparatus: SHIMADZU UV-3600 manufactured by SHIMADZU CORPORATION
[Etching Rate]
  Apparatus: ES 401 manufactured by Nippon Scientific Co., Ltd.
  Etching gas: $CF_4$ Synthetic Example 1

Under a nitrogen atmosphere, to a 100 mL four-neck flask, carbazole (10.0 g, 59.8 mmol, manufactured by Tokyo Chemical Industry Co., Ltd.), benzaldehyde (6.41 g, 60.4 mmol, manufactured by Junsei Chemical Co., Ltd.), and para-toluenesulfonic acid monohydrate (1.19 g, 62.6 mmol, manufactured by Kanto Chemical Co., Inc.) were added. Furthermore, 1,4-dioxane (15 g, manufactured by Kanto Chemical Co., Inc) was added, then the temperature was raised to 100° C. with stirring, and the mixture was polymerized for 2 hours. After the completion of the reaction, the mixture was allowed to cool to 60° C., then chloroform (50 g, manufactured by Kanto Chemical Co., Inc.) was added to the mixture for dilution, and the solution was added to methanol (250 g, manufactured by Kanto Chemical Co., Inc.) for precipitation. The obtained precipitate was filtered, then dried in a vacuum dryer at 60° C. for 10 hours, and further dried at 120° C. for 24 hours to give 8.64 g of an object polymer (Formula (1-1), hereinafter abbreviated as PCzBA).

FIG. 1 shows the measurement result of $^1$H-NMR spectrum of PCzBA.

The measurement result of $^1$H-NMR of PCzBA is as follows.

$^1$H-NMR (300 MHz, $DMSO-d_6$): δ 5.29-6.40 (br, 1H), δ 6.41-7.53 (br, 9H), δ 7.54-8.34 (br, 2H), δ 10.49-11.46 (br, 1H).

PCzBA had a weight average molecular weight Mw of 4,000 and a degree of polydispersion Mw/Mn of 1.69 in terms of polystyrene by GPC.

Synthetic Example 2

Under a nitrogen atmosphere, to a 100 mL four-neck flask, carbazole (8.0 g, 47.8 mmol, manufactured by Tokyo Chemical Industry Co., Ltd.), 1-naphthaldehyde (7.55 g, 48.3 mmol, manufactured by Tokyo Chemical Industry Co., Ltd.), and para-toluenesulfonic acid monohydrate (0.95 g, 50.0 mmol, manufactured by Kanto Chemical Co., Inc.) were added. Furthermore, 1,4-dioxane (8 g, manufactured by Kanto Chemical Co., Inc.) was added, then the temperature was raised to 100° C. with stirring, and the mixture was polymerized for 4 hours. After the completion of the reaction, the mixture was allowed to cool to 60° C., then chloroform (40 g, manufactured by Kanto Chemical Co., Inc.) was added to dilute the mixture, and the solution was added to methanol (200 g, manufactured by Kanto Chemical Co., Inc.) for precipitation. The obtained precipitate was filtered, then dried in a vacuum dryer at 60° C. for 10 hours, and further dried at 120° C. for 24 hours to give 10.03 we of an object polymer (Formula (1-2), hereinafter abbreviated as PCzNA).

Figure 2:
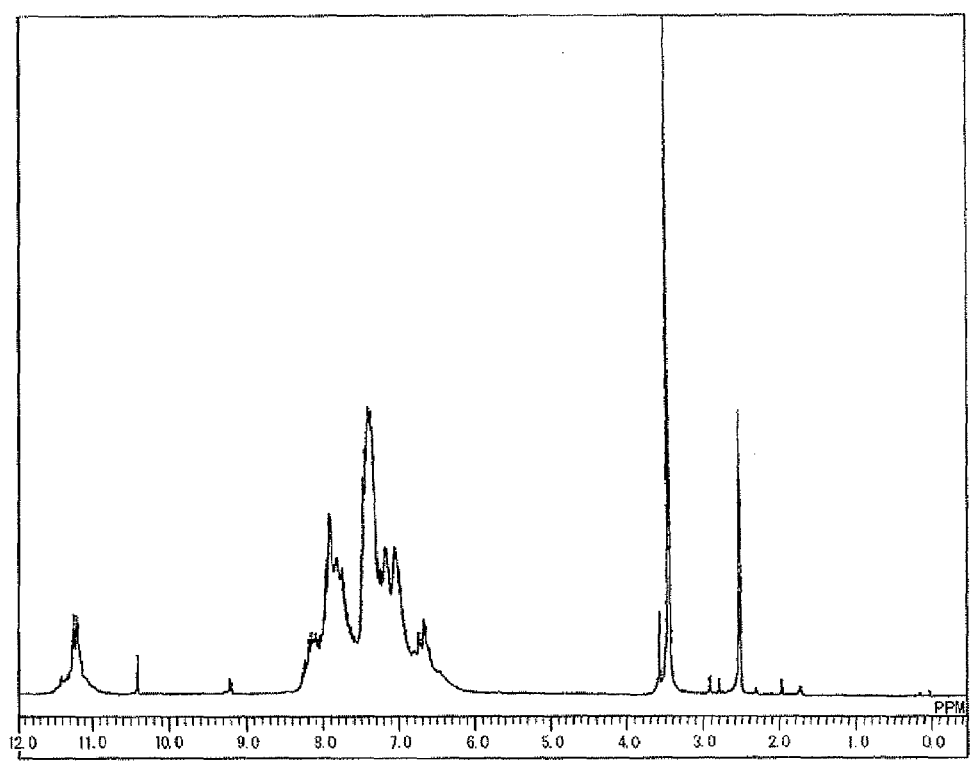
FIG. 2 is a $^1$H-NMR spectrum of a polymer obtained in Synthetic Example 2.

FIG. 2 shows the measurement result of $^1$H-NMR spectrum of PCzNA.

The measurement result of $^1$H-NMR of PCzNA is as follows.

$^1$H-NMR (300 MHz, $DMSO-d_6$): δ 6.01-7.57 (br, 9H), δ 7.58-8.57 (br. 5H), δ 10.75-11.63 (br, 1H).

PCzNA had a weight average molecular weight Mw of 2,600 and a degree of polydispersion Mw/Mn of 1.30 in terms of polystyrene by GPC.

Synthetic Example 3

Under a nitrogen atmosphere, to a 100 mL four-neck flask, carbazole (8.2 g, 49.0 mmol, manufactured by Tokyo Chemical Industry Co., Ltd.), benzaldehyde (6.49 g, 61.2 mmol, manufactured by Tokyo Chemical Industry Co., Ltd.), triphenylamine (3.0 g, 12.2 mmol, manufactured by Tokyo Chemical Industry Co., Ltd.), and para-toluenesulfonic acid monohydrate (1.22 g, 6.4 mmol, manufactured by Kanto Chemical Co. Inc.) were added. Furthermore, 1,4-dioxane (15 g, manufactured by Kanto Chemical Co., Inc.) was added, then the temperature was raised to 100° C. with stirring, and the mixture was polymerized for 1.5 hours. After the completion of the reaction, the mixture was allowed to cool to 30° C., then chloroform (60 g, manufactured by Kanto Chemical Co., Inc.) was added to dilute the mixture, and the solution was added to methanol (300 g, manufactured by Kanto Chemical Co., Inc.) for precipitation. The obtained precipitate was filtered, then dried in a vacuum dryer at 60° C. for 10 hours, and further dried at 120° C. for 24 hours to give 11.74 g of object polymers (a mixture of Formula (2-1) and Formula (3-1), hereinafter abbreviated as PTPABACz).

Figure 3:
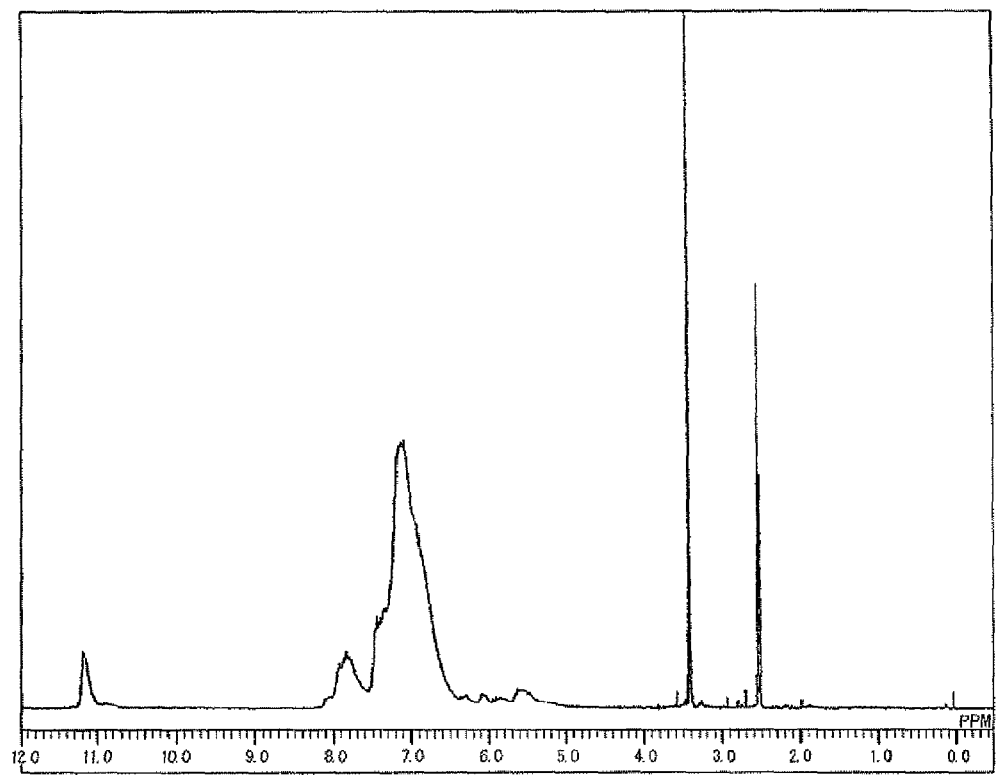
FIG. 3 is a $^1$H-NMR spectrum of a polymer obtained in Synthetic Example 3.

FIG. 3 shows the measurement result of $^1$H-NMR spectrum of PTPABACz.

The measurement result of $^1$H-NMR of PTPABACz is as follows.

$^1$H-NMR (300 MHz, DMSO-$d_6$): δ 4.74-6.36 (br, 1.2H), δ 6.38-7.54 (br, 12H), δ 7.57-8.31 (br, 2H), δ 10.48-11.50 (br, 1H).

PTPABACz had a weight average molecular weight Mw of 6,400 and a degree of polydispersion Mw/Mn of 1.93 in terms of polystyrene by GPC.

Synthetic Example 4

Under a nitrogen atmosphere, to a 100 mL four-neck flask, carbazole (6.7 g, 40.0 mmol, manufactured by Tokyo Chemical Industry Co., Ltd.), 9-fluorenone (7.28 g, 40.4 mmol, manufactured by Tokyo Chemical Industry Co., Ltd.), and para-toluenesulfonic acid monohydrate (0.76 g, 40.0 mmol, manufactured by Tokyo Chemical Industry Co., Ltd.) were added. Furthermore, 1,4-dioxane (6.69 g. manufactured by Kanto Chemical Co., Inc.) was added, then the temperature was raised to 100° C. with stirring, and the mixture was polymerized for 24 hours. After the completion of the reaction, the mixture was allowed to cool to 60° C., then chloroform (34 g, manufactured by Kanto Chemical Co., Inc.) was added to dilute the mixture, and the solution was added to methanol (168 g, manufactured by Kanto Chemical Co., Inc.) for precipitation. The obtained precipitate was filtered, and dried in a vacuum dryer at 80° C. for 24 hours to give 9.37 g of an object polymer (Formula (1-5), hereinafter abbreviated as PCzFL).

Figure 4:
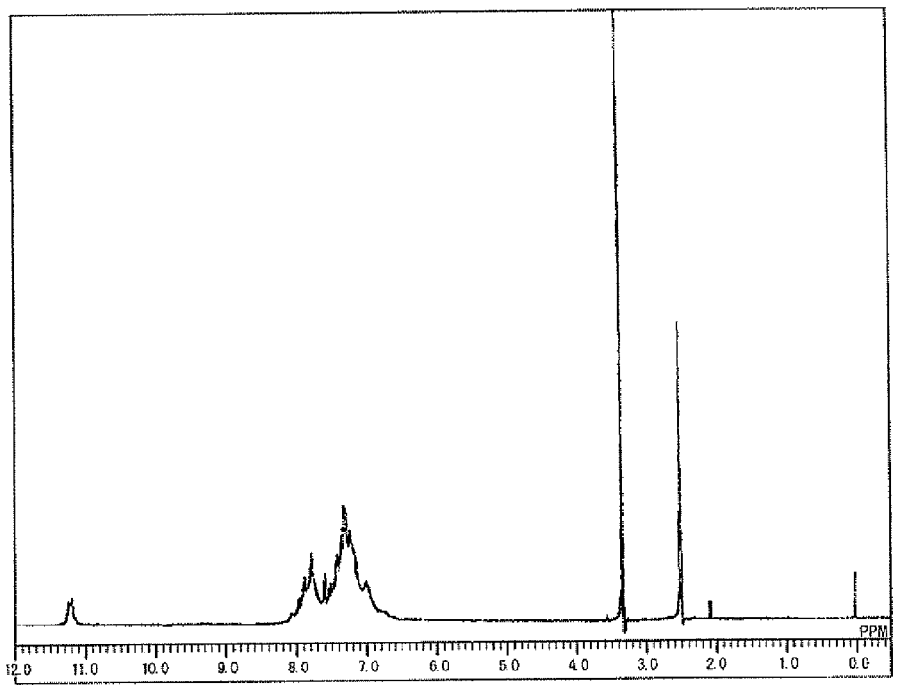
FIG. 4 is a $^1$H-NMR spectrum of a polymer obtained in Synthetic Example 4.

FIG. 4 shows the measurement result of $^1$H-NMR spectrum of PCzFL.

The measurement result of $^1$H-NMR of PCzFL is as follows.

$^1$H-NMR (400 MHz, DMSO-$d_6$): δ 7.03-7.55 (br, 12H), δ 7.61-8.10 (br, 4H) δ 11.18 (br, 1H).

PCzFL had a weight average molecular weight Mw of 2,800 and a degree of polydispersion Mw/Mn of 1.77 in terms of polystyrene by GPC.

Synthetic Example 5

Under as nitrogen atmosphere, to a 100 mL four-neck flask, carbazole (10.0 g, 59.8 mmol, manufactured by Tokyo Chemical Industry Co., Ltd.), benzaldehyde (6.41 g. 60.4 mmol, manufactured by Junsei Chemical Co., Ltd.), and para-toluenesulfonic acid monohydrate (1.19 g, 62.6 mmol, manufactured by Kanto Chemical Co., Inc.) were added. Furthermore, 1,4-dioxane (10.0 g, by Kanto Chemical Co., Inc.) was added, then the temperature was raised to 100° C. with stirring, and the mixture was polymerized for 1 hour. After the completion of the reaction, the mixture was allowed to cool to 60° C., then chloroform (50 g, manufactured by Kanto Chemical Co., Inc.) was added to dilute the mixture, and the solution was added to methanol (250 g, manufactured by Kanto Chemical Co., Inc.) for precipitation. The obtained precipitate was filtered, and redissolved in chloroform (20 g). Then, the solution was added to methanol (250 g, manufactured by Kanto Chemical Co., Inc.) for reprecipitation. The obtained precipitate was filtered once again, and dried in a vacuum dryer at 60° C. for 10 hours to give 9.86 g of an object polymer (Formula (1-1), hereinafter abbreviated as PCzBA).

Figure 5:
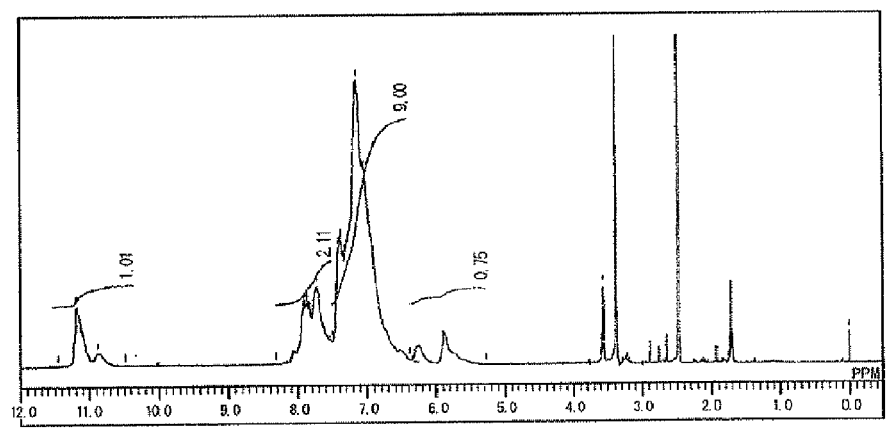
FIG. 5 is a $^1$H-NMR spectrum of a polymer obtained in Synthetic Example 5.

FIG. 5 shows $^1$H NMR spectrum of PCzBA obtained. PCzBA had a weight average molecular weight Mw of 4,100 and a degree of polydispersion Mw/Mn of 1.55 in terms of polystyrene by GPC.

Synthetic Example 6

Under a nitrogen atmosphere, to a 1 L tour-neck flask, carbazole (100.0 g, 598 mmol, manufactured by Tokyo Chemical Industry Co., Ltd.). 1-naphthaldehyde (94.3 g, 604 mmol, manufactured by Junsei Chemical Co., Ltd.), and para-toluenesulfonic acid monohydrate (11.9 g, 59.8 mmol, manufactured by Kanto Chemical Co., Inc.) were added. Furthermore, 1,4-dioxane (100.0 g, manufactured by Kanto Chemical Co., Inc.) was added, then the temperature was raised to 100° C. with stirring, and the mixture was polymerized for 5 hours. After the completion of the reaction, the mixture was allowed to cool to 60° C., then chloroform (500 g, manufactured by Kanto Chemical Co., Inc.) was added to dilute the mixture, and the solution was added to methanol (2,500 g, manufactured by Kanto Chemical Co., Inc.) for precipitation. The obtained precipitate was filtered, and redissolved in chloroform (300 g). Then, the solution was added to methanol (2,500 g, manufactured by Kanto Chemical Co., Inc.) for reprecipitation. The obtained precipitate was filtered once again, and dried in a vacuum dryer at 60° C. for 10 hours to give 95.5 g of an object polymer (Formula (1-2), hereinafter abbreviated as PCzNA).

Figure 6:
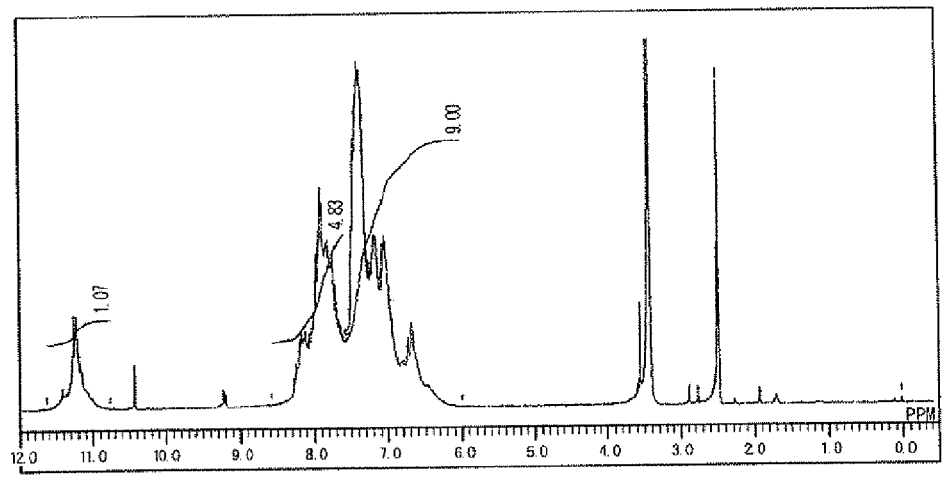
FIG. 6 is a $^1$H-NMR spectrum of a polymer obtained in Synthetic Example 6.

FIG. 6 shows $^1$H NMR spectrum of PCzNA obtained. PCzNA had a weight average molecular weight Mw of 2,100 and a degree of polydispersion Mw/Mn of 1.34 in terms of polystyrene by GPC.

Synthetic Example 7

Under a nitrogen atmosphere, to a 100 mL four-neck flask, carbazole (5.0 g, 0.0179 mol, manufactured by Tokyo Chemical Industry Co., Ltd.), 9-anthracenecarboxaldehyde (3.74 g, 0.0181 mol (1.01 eq with respect to carbazole), manufactured by Junsei Chemical Co., Ltd.), and para-toluenesulfonic acid monohydrate (1.25 g, 0.00657 mol (0.37 eq), manufactured by Kanto Chemical Co Inc.) were added. Furthermore, 1,4-dioxane (3.0 g, manufactured by Kanto Chemical Co., Inc.) was added, then the temperature was raised to 100° C. with stirring, and the mixture was polymerized for 7 hours. After the completion of the reaction, the mixture was allowed to cool to 60° C., then chloroform (10 g, manufactured by Kanto Chemical Co., Inc.) was added to dilute the mixture, and the solution was added to methanol (100 g, manufactured by Kanto Chemical Co., Inc.) for reprecipitation. The obtained precipitate was filtered, and dried in a vacuum dryer at 60° C. for 10 hours to give 4.13 g of an object polymer (Formula (1-6), hereinafter abbreviated as PCzAA).

Figure 7:
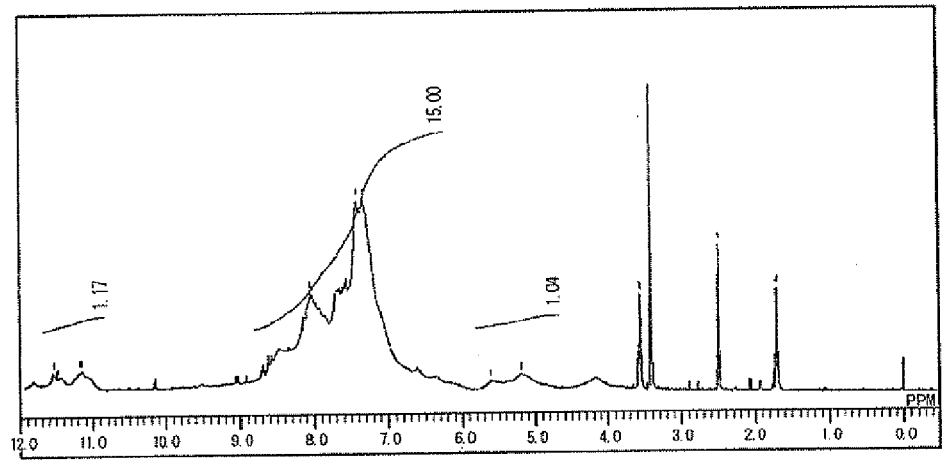
FIG. 7 is a $^1$H-NMR spectrum of a polymer obtained in Synthetic Example 7.

FIG. 7 shows $^1$H NMR spectrum of PCzAA obtained. PCzAA had a weight average molecular weight Mw of 2,100 and a degree of polydispersion Mw/Mn of 1.77 in terms of polystyrene by GPC.

Synthetic Example 8

Under a nitrogen atmosphere, to a 100 mL four-neck flask, carbazole (5.0 g, 29.9 mmol, manufactured by Tokyo Chemical Industry Co., Ltd.) 4-phenylbenzaldehyde (5.50 g, 30.2 mmol, manufactured by Junsei Chemical Co., Ltd.), and para-toluenesulfonic acid monohydrate (2.09 g, 6.57 mmol, manufactured by Kanto Chemical Co., Inc.) were added. Furthermore, 1,4-dioxane (5.0 g, manufactured by Kanto Chemical Co., Inc.) was added, then the temperature was raised to 100° C. with stirring, and the mixture was polymerized for 20 minutes. After the completion of the reaction, the mixture was allowed to cool to 60° C., then chloroform (25 g, manufactured by Kanto Chemical Co., Inc.) was added to dilute the mixture, and the solution was added to methanol (125 g, manufactured by Kanto Chemical Co., Inc.) for reprecipitation. The obtained precipitate was filtered, and redissolved in chloroform (25 g). Then, the solution was added to methanol (125 g, manufactured by Kanto Chemical Co., Inc.) for reprecipitation. The obtained precipitate was filtered, and dried in a vacuum dryer at 60° C. for 10 hours to give 7.75 g of an object polymer (Formula (1-7), hereinafter abbreviated as PCzPBA).

Figure 8:
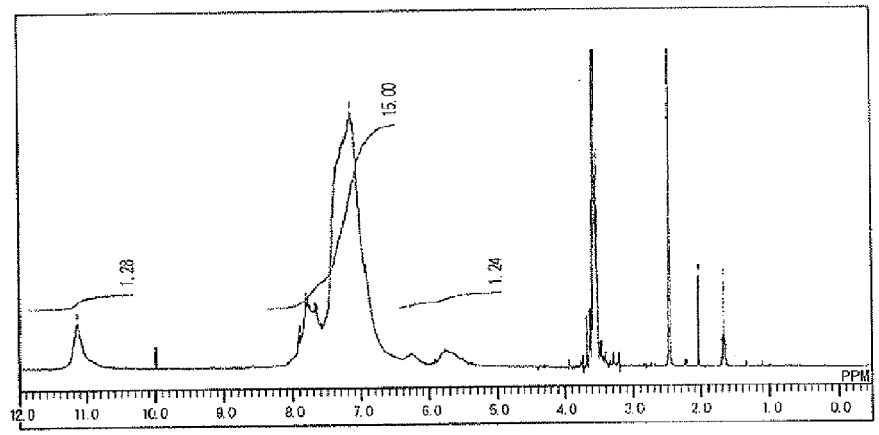
FIG. 8 is a $^3$H-NMR spectrum of a polymer obtained in Synthetic Example 8.

FIG. 8 shows $^1$H NMR spectrum of PCzPBA obtained. PCzPBA had a weight average molecular weight Mw of 3,800 and a degree of polydispersion Mw/Mn of 1.52 in terms of polystyrene by GPC.

Synthetic Example 9

Under a nitrogen atmosphere, to a 100 mL four-neck flask, carbazole (5.0 g, 29.9 mmol, manufactured by Tokyo Chemical Industry Co., Ltd.), p-anisaldehyde (4.11 g, 30.2 mmol, manufactured by Junsei Chemical Co., Ltd.), and para-toluenesulfonic acid monohydrate (2.11 g, 11.1 mmol, manufactured by Kanto Chemical Co., Inc.) were added. Furthermore, 1,4-dioxane (5.0 g, manufactured by Kanto Chemical Co., Inc.) was added, then the temperature was raised to 100° C. with stirring, and the mixture was polymerized for 30 minutes. After the completion of the reaction, the mixture was allowed to cool to 60° C. then chloroform (10 g, manufactured by Kanto Chemical Co., Inc.) was added to dilute the mixture, and the solution was added to methanol (100 g, manufactured by Kanto Chemical Co., Inc.) for precipitation. The obtained precipitate was filtered, and redissolved in chloroform (10 g). Then, the solution was added to methanol (100 g, manufactured by Kanto Chemical Co., Inc.) for reprecipitation. The obtained precipitate was filtered once again, and dried in a vacuum dryer at 60° C. for 10 hours to give 4.17 g of an object polymer (Formula (1-10), hereinafter abbreviated as PCzpAA).

Figure 9:
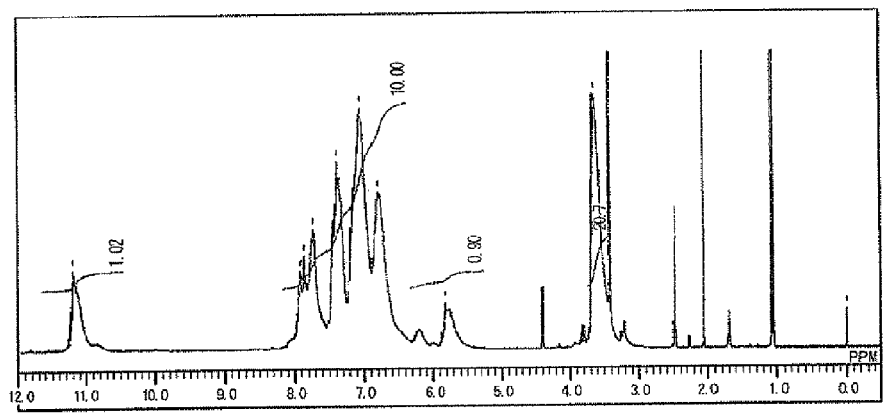
FIG. 9 is a $^1$H-NMR spectrum of a polymer obtained in Synthetic Example 9.

FIG. 9 shows $^1$H NMR spectrum of PCzpAA obtained. PCzpAA had as weight average molecular weight Mw of 2,800 and a degree of polydispersion Mw/Mn of 1.96 in terms of polystyrene by GPC.

Synthetic Example 10

Under a nitrogen atmosphere, to a 100 mL four-neck flask, carbazole (3.0 g, 17.9 mmol, manufactured by Tokyo Chemical Industry Co., Ltd.), 3-thiophenaldehyde (2.03 g, 18.1 mmol, manufactured by Junsei Chemical Co., Ltd.), and para-toluenesulfonic acid monohydrate (0.34 g, 1.79 mmol, manufactured by Kanto Chemical Co., Inc.) were added. Furthermore, 1,4-dioxane (3.0 g, manufactured by Kanto Chemical Co., Inc.) was added, then the temperature was raised to 100° C. with stirring, and the mixture was polymerized for 30 minutes. After the completion of the reaction, the mixture was allowed to cool to 60° C., then chloroform (10 g manufactured by Kanto Chemical Co., Inc.) was added to dilute the mixture, and the solution was added to methanol (100 g, manufactured by Kanto Chemical Co., Inc.) for reprecipitation. The obtained precipitate was filtered, and redissolved in chloroform (8 g). Then, the solution was added to methanol (100 g, manufactured by Kanto Chemical Co., Inc.) for reprecipitation. The obtained precipitate was filtered once again, and dried in a vacuum dryer at 60° C. for 10 hours to give 3.11 g of an object polymer (Formula (1-8), hereinafter abbreviated as PCzTA).

Figure 10:
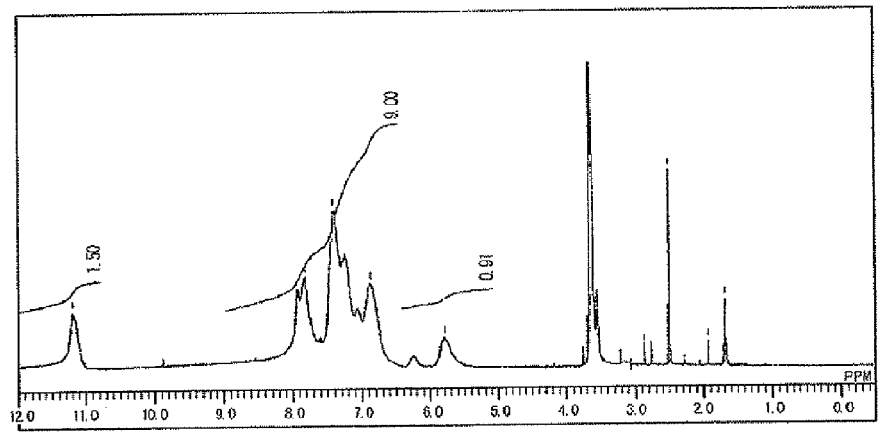
FIG. 10 is a $^1$H-NMR spectrum of a polymer obtained in Synthetic Example 10.

FIG. 10 shows $^1$H NMR spectrum of PCzTA obtained. PCzTA had a weight average molecular weight Mw of 4,800 and a degree of polydispersion Mw/Mn of 1.85 in terms of polystyrene by GPC.

Synthetic Example 11

Under a nitrogen atmosphere, to a 100 mL four-neck flask, carbazole (3.0 g, 17.9 mmol, manufactured by Tokyo Chemical Industry Co., Ltd.), terephthalaldehyde (1.22 g, 9.15 mmol, manufactured by Junsei Chemical Co., Ltd.), and para-toluenesulfonic acid monohydrate (0.36 g, 1.88 mmol, manufactured by Kanto chemical Co., Inc.) were added. Furthermore, 1,4-dioxane (3.0 g, manufactured by Kanto Chemical Co., Inc.) was added, then the temperature was raised, to 100° C. with stirring, and the mixture was polymerized for 30 minutes. After the completion of the reaction, the mixture was allowed, to cool to 60° C., then chloroform (10 g, manufactured by Kanto Chemical Co., Inc.) was added to dilute the mixture, and the solution was added to methanol (100 g, manufactured by Kanto Chemical Co., Inc.) for reprecipitation. The obtained precipitate was filtered, and redissolved in chloroform (8 g). Then, the solution was added to methanol (100 g, manufactured by Kanto Chemical Co., Inc.) for reprecipitation. The obtained precipitate was filtered once again, and dried in a vacuum dryer at 60° C. for 10 hours to give 2.62 g of an object polymer (Formula (1-11), hereinafter abbreviated as PCzTPA).

Figure 11:
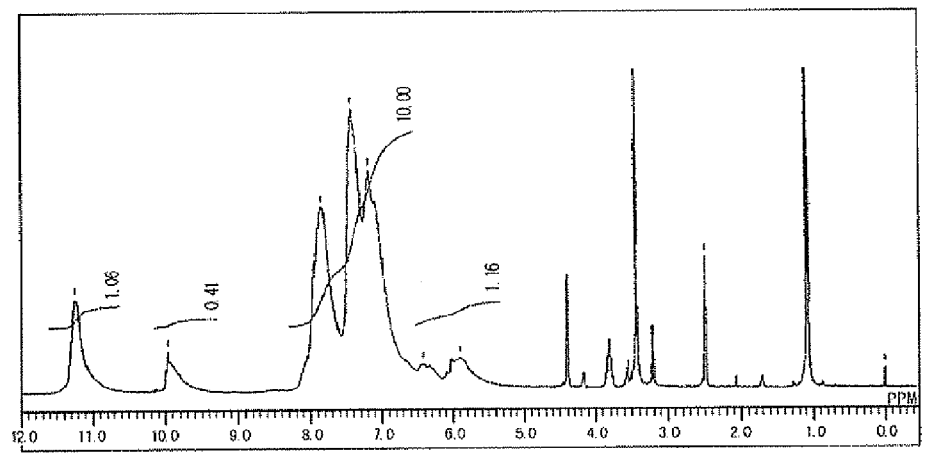
FIG. 11 is a $^1$H-NMR spectrum of a polymer obtained in Synthetic Example 11.

FIG. 11 shows $^1$H NMR spectrum of PCzTPA obtained. PCzTPA had a weight average molecular weight Mw of 6,300 and a degree of polydispersion Mw/Mn of 2.50 in terms of polystyrene by GPC.

Synthetic Example 12

Under a nitrogen atmosphere, to a 100 mL four-neck flask, 9-ethylcarbazole (3.0 g, 15.4 mmol, manufactured by Tokyo Chemical Industry Co., Ltd.), benzaldehyde (1.65 g, 15.5 mmol, manufactured by Junsei Chemical Co., Ltd.), and para-toluenesulfonic acid monohydrate (0.29 g, 1.54 mmol, manufactured by Kanto Chemical Co., Inc.) were added. Furthermore, 1,4-dioxane (3.0 g, manufactured by Kanto Chemical Co., Inc.) was added, then the temperature was raised to 110° C. with stirring, and the mixture was polymerized for 4 hours. After the completion of the reaction, the mixture was allowed to cool to 60° C., THF (10 g, manufactured by Kanto Chemical Co., Inc.) was added to dilute the mixture, and the solution was added to methanol (100 g, manufactured by Kanto Chemical Co., Inc.) for precipitation. The obtained precipitate was filtered, and redissolved in THF (10 g, manufactured by Kanto Chemical Co., Inc.). Then, the solution was added to a mixed solvent of methanol (60 g, manufactured by Kanto Chemical Co., Inc.) and THF (30 g, manufactured by Kanto Chemical Co., Inc.) for reprecipitation. The obtained precipitate was filtered once again, and dried in a vacuum dryer at 60° C. for 10 hours to give 2.60 g of an object polymer (Formula (1-12), hereinafter abbreviated as PEtCzBA).

Figure 12:
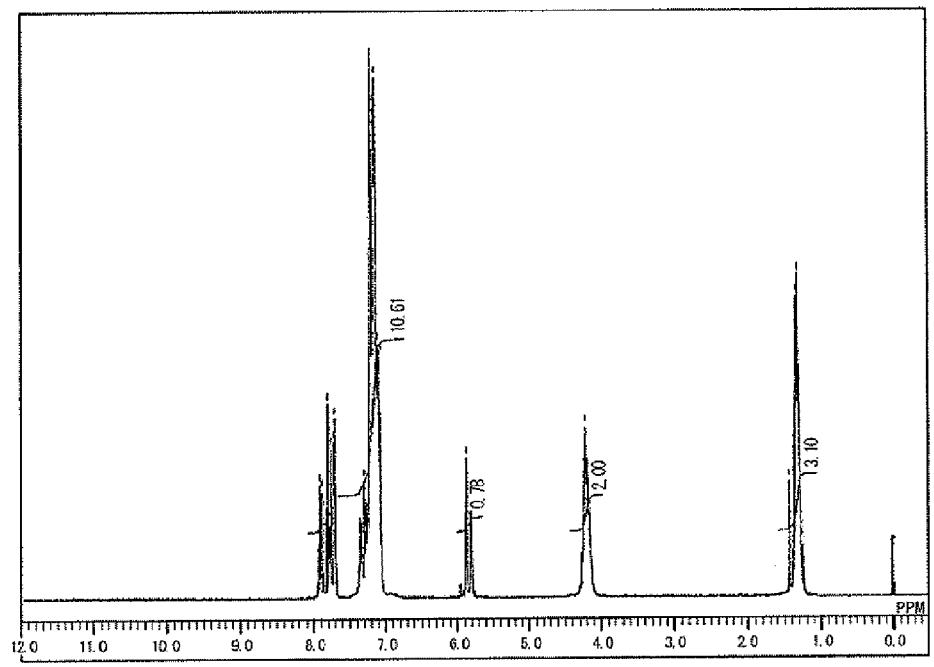
FIG. 12 is a $^1$H-NMR spectrum of a polymer obtained in Synthetic Example 12.

FIG. 12 shows $^1$H NMR spectrum of PEtCzBA obtained. PEtCzBA had a weight average molecular weight Mw of 1,200 and a degree of polydispersion Mw/Mn of 1.27 in terms of polystyrene by GPC.

Synthetic Example 13

Under a nitrogen atmosphere, to a 100 mL four-neck flask, 9-ethylcarbazole (3.0 g, 15.4 mmol, manufactured by Tokyo Chemical industry Co., Ltd.), 1-naphthaldehyde (2.42 g, 15.5 mmol, manufactured by Junsei Chemical Co., Ltd.), and para-toluenesulfonic acid monohydrate 0.29 g, 1.54 mmol, manufactured by Kanto Chemical Co., Inc.) were added. Furthermore, 1,4-dioxane (3.0 g, manufactured by Kanto Chemical Co., Inc.) was added, then the temperature was raised to 110° C. with stirring, and the mixture was polymerized for 12 hours. After the completion of the reaction, the mixture was allowed to cool to 60° C., THF (10 g, manufactured by Kanto Chemical Co., Inc.) was added to dilute the mixture, and the solution was added to methanol (100 g, manufactured by Kanto Chemical Co., Inc.) for precipitation. The obtained precipitate was filtered, and redissolved in THF (10 g, manufactured by Kanto Chemical Co., Inc.). Then, the solution was added to a mixed solvent of methanol (60 g, manufactured by Kanto Chemical Co., Inc.) and THF (30 g, manufactured by Kanto Chemical Co., Inc.) for reprecipitation. The obtained precipitate was filtered once again, and dried in a vacuum dryer at 60° C. for 10 hours to give 2.61 g of an object polymer (Formula (1-13), hereinafter abbreviated as PEtCzNA).

Figure 13:
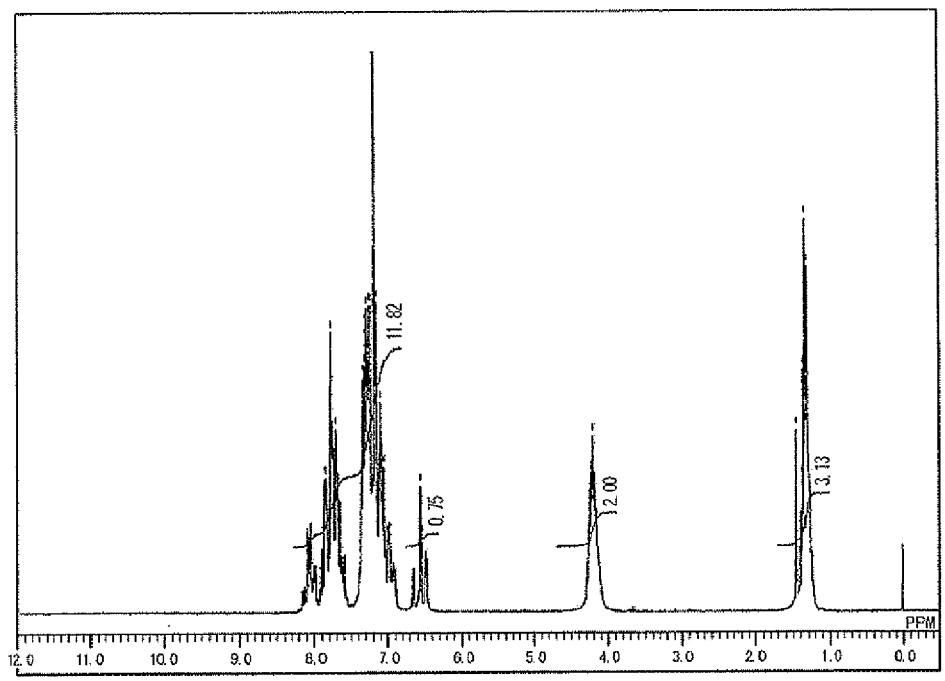
FIG. 13 is a spectrum of a polymer obtained in Synthetic Example 13.

FIG. 13 shows $^1$H NMR spectrum of PEtCzNA obtained. PEtCzNA had a weight average molecular weight Mw of 1,000 and a degree of polydispersion Mw/Mn of 1.29 in terms of polystyrene by GPC.

Comparative Synthetic Example 1

Under a nitrogen atmosphere, to a 100 mL four-neck flask, diphenylamine (2.0 g, 11.8 mmol, manufactured by Tokyo Chemical Industry Co., Ltd.), benzaldehyde (1.27 g, 11.9 mmol, manufactured by Junsei Chemical Co., Ltd.), and para-toluenesulfonic acid monohydrate (0.25 g, 1.32 mol, manufactured by Kanto Chemical Co., Inc.) were added. Furthermore, 1,4-dioxane (4.0 g, manufactured by Kanto Chemical Co., Inc.) was added, then the temperature was raised to 100° C. with stirring, and the mixture was polymerized for 45 minutes. After the completion of the reaction, the mixture was allowed to cool to 60° C. then chloroform (20 g, manufactured by Kanto Chemical Co., Inc.) was added to dilute the mixture, and the solution was added to methanol (100 g, manufactured by Kanto Chemical Co., Inc.) for precipitation. The obtained precipitate was filtered, and redissolved in chloroform (8 g). Then, the solution was added to methanol (100 g, manufactured by Kanto Chemical Co., Inc.) for reprecipitation. The obtained precipitate was filtered once again, and dried in a vacuum dryer at 60° C. for 10 hours to give 2.27 g of an object polymer (hereinafter abbreviated as PDPABA).

Figure 14:
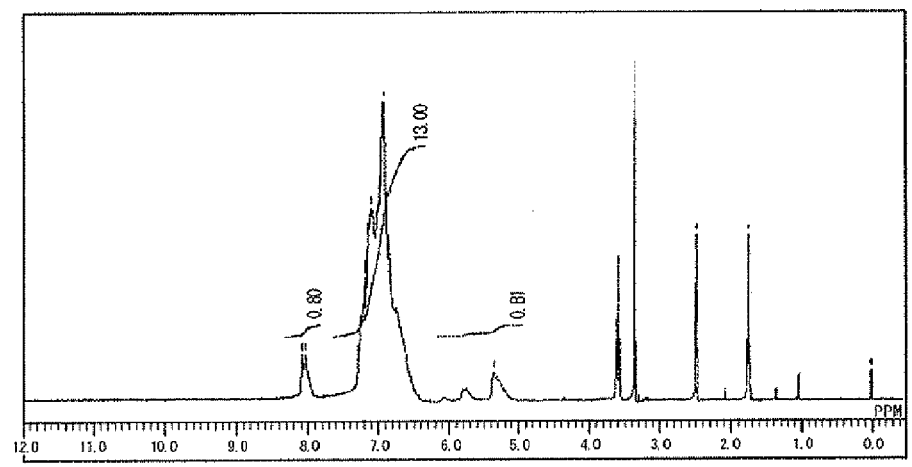
FIG. 14 is a $^1$H-NMR spectrum of a polymer obtained in Comparative Synthetic Example 1.

FIG. 14 shows $^1$H NMR spectrum of PDPABA obtained, PDPABA had a weight average molecular weight Mw of 9,900 and a degree of polydispersion Mw/Mn of 2.47 in terms of polystyrene by GPC.

Comparative Synthetic Example 2

Under a nitrogen atmosphere, to a 100 mL four-neck flask, phenol (2.0 g. 21.3 mmol, manufactured by Junsei Chemical Co., Ltd.), benzaldehyde (4.51 g, 42.5 mmol, manufactured by Junsei Chemical Co., Ltd.), and para-toluenesulfonic acid monohydrate (4.06 g, 21.3 mmol, manufactured by Kanto Chemical Co., Inc.) were added. Furthermore, 1,4-dioxane (4.0 g, manufactured by Kanto Chemical Co., Inc) was added, then the temperature was raised to 100° C. with stirring, and the mixture was polymerized for 1 hour. After the completion of the reaction, the mixture was allowed to cool to 60° C., then the solution was added to a mixed solvent of pure water (200 g) and methanol (40 g, manufactured by Kanto Chemical Co., Inc.) for reprecipitation. The obtained precipitate was filtered, and redissolved in chloroform (20 g). Then, the solution was added to a mixed solvent of pure water (200 g) and methanol (40 g, manufactured by Kanto Chemical Co., Inc.) for reprecipitation. The obtained precipitate was filtered once again, and dried in a vacuum dryer at 60° C. for 10 hours to give 3.88 g of an object polymer (hereinafter abbreviated as PPBA).

Figure 15:
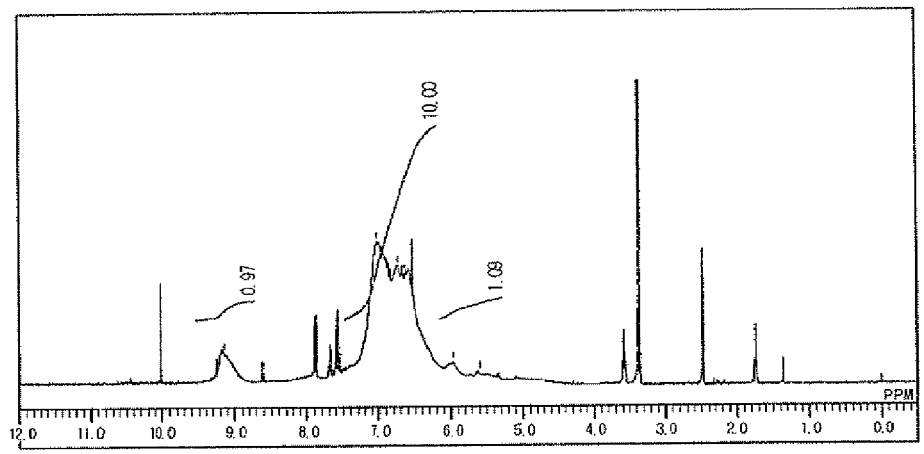
FIG. 15 is a $^1$H-NMR spectrum of a polymer obtained in Comparative Synthetic Example 2.
Figure 16:
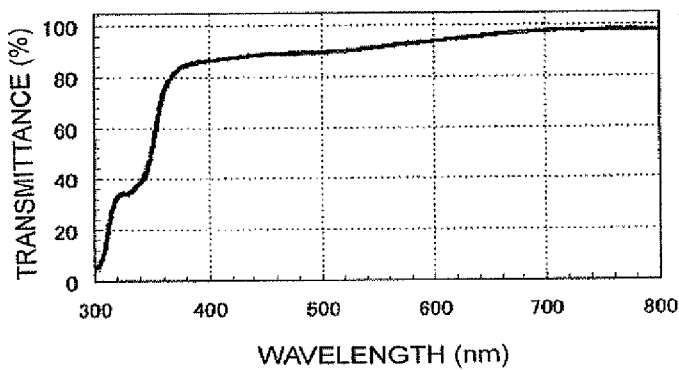
FIG. 16 is a view showing light transmittance of a thin film obtained in Example 7.
Figure 17:
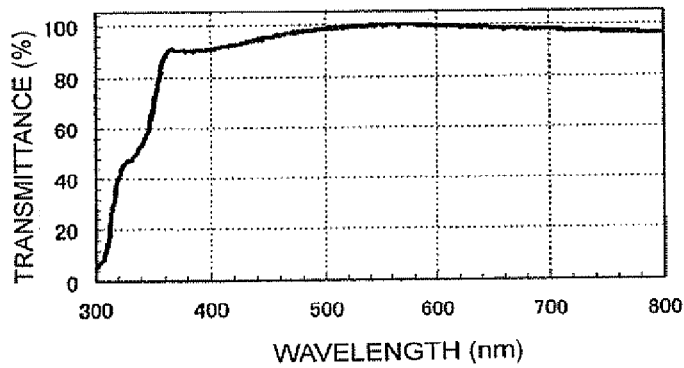
FIG. 17 is a view showing light transmittance of a thin film obtained in Example 8.
Figure 18:
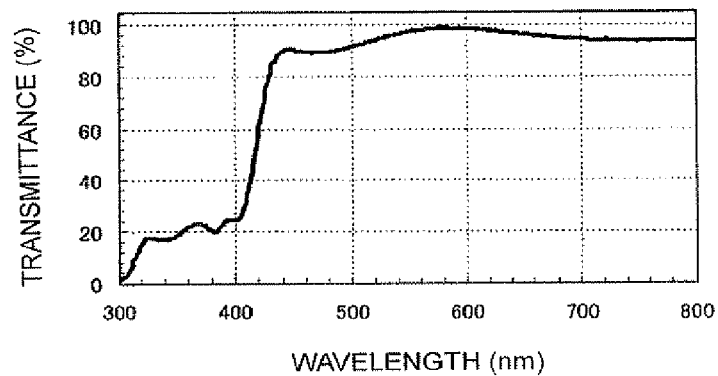
FIG. 18 is a view showing light transmittance of a thin film obtained in Example 9.
Figure 19:
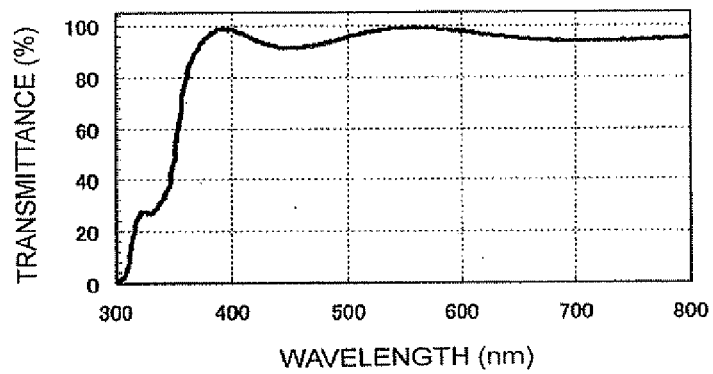
FIG. 19 is a view showing light transmittance of a thin film obtained in Example 10.
Figure 20:
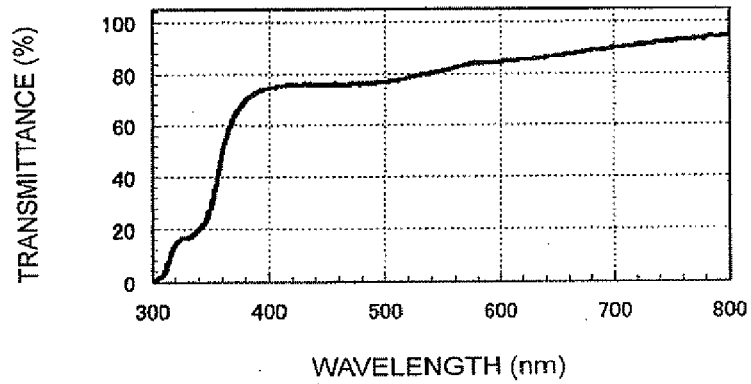
FIG. 20 is a view showing light transmittance of a thin film obtained in Example 11.
Figure 21:
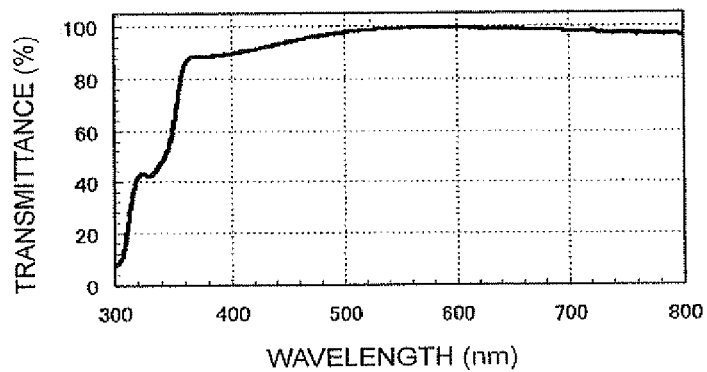
FIG. 21 is a view showing light transmittance of a thin film obtained in Example 12.
Figure 22:
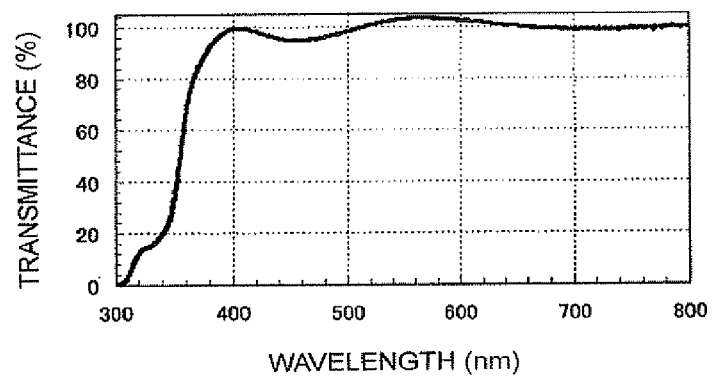
FIG. 22 is a view showing light transmittance of a thin film obtained in Example 13.
Figure 23:
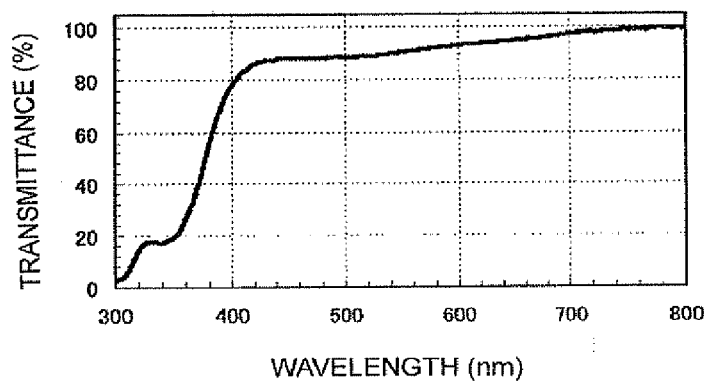
FIG. 23 is a view showing light transmittance of a thin film obtained in Example 14.
Figure 24:
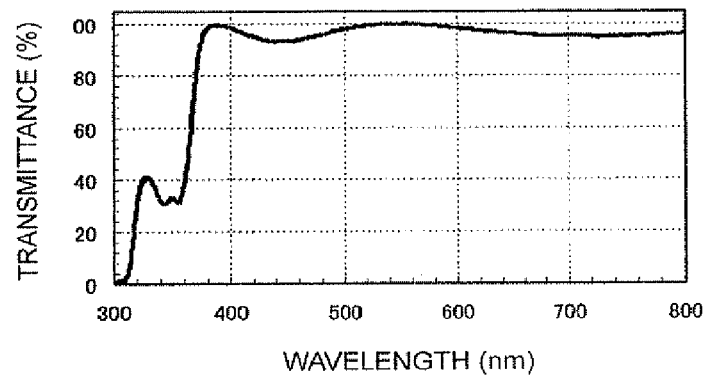
FIG. 24 is a view showing light transmittance of a thin film obtained in Example 15.
Figure 25:
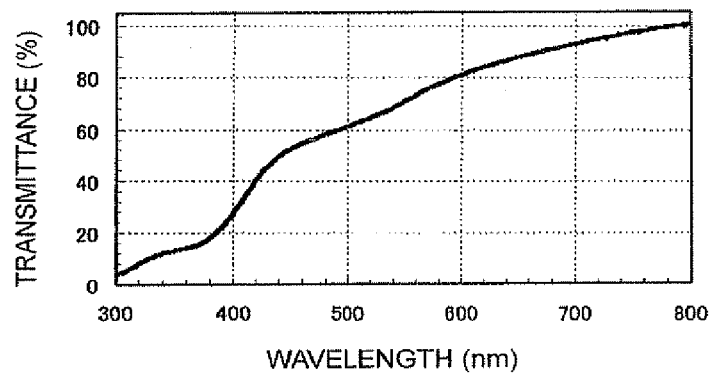
FIG. 25 is a view showing light transmittance of a thin film obtained in Comparative Example 2.
Figure 26:
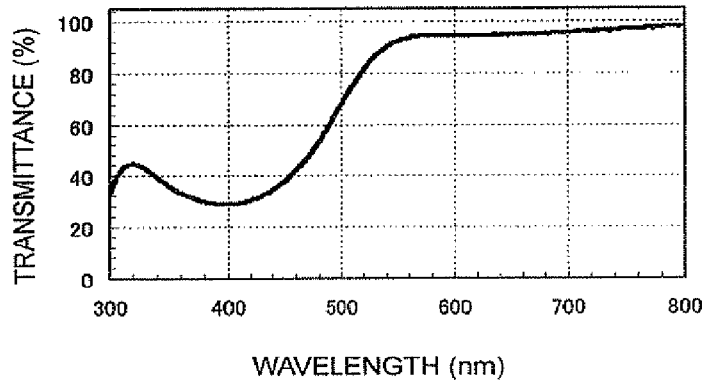
FIG. 26 is a view showing light transmittance of a thin film obtained in Comparative Example 3.

FIG. 15 shows $^1$H NMR spectrum of PPBA obtained, PPBA had a weight average molecular weight Mw of 23,000 and a degree of polydispersion Mw/Mn of 6.24 in terms of polystyrene by GPC.

Example 1

To 20 g of PCzBA synthesized in Synthetic Example 1, 0.06 g of MEGAFAC R-30 (manufactured by Dainippon Ink and Chemicals, Inc., trade name) was mixed as a surfactant, and the mixture was dissolved in 80 g of propylene glycol monomethyl ether acetate. The solution was filtered using a polyethylene microfilter having a pore size of 0.10 μm, and further filtered using a polyethylene microfilter having a pore size of 0.05 μm to prepare a solution of a resist underlayer film forming composition used for a lithography process using a multilayer film.

Example 2

To 20 g of PCzBA synthesized in Synthetic Example 1, 2.0 g of TM-BIP-A (manufactured by Asahi Organic Chemicals Industry Co., Ltd, trade name) as a cross-linking agent, 0.10 g of pyridinium para-toluenesulfonate as a catalyst, and 0.06 g of MEGAFAC R-30 (manufactured by Dainippon Ink and Chemicals, Inc., trade name) as a surfactant were mixed, and the mixture was dissolved in 88 g of propylene glycol monomethyl ether acetate. The solution was filtered, using a polyethylene microfilter having a pore size of 0.10 μm, and further filtered using a polyethylene microfilter having a pore size of 0.05 μm to prepare a solution of a resist underlayer film forming composition used for a lithography process using to multilayer film.

Example 3

To 20 g of PCzNA obtained in Synthetic Example 2, 0.06 g of MEGAFAC R-30 (manufactured by Dainippon Ink and Chemicals, Inc., trade name) was mixed as a surfactant, and the mixture was dissolved in 80 g of propylene glycol monomethyl ether acetate. The solution was filtered using as polyethylene microfilter having a pore size of 0.10 μm, and further filtered using a polyethylene microfilter having a pore size of 0.05 μm to prepare a solution of a resist underlayer film forming composition used for a lithography process using a multilayer film.

Example 4

To 20 g of PTPABACz obtained in Synthetic Example 3, 0.06 g of MEGAFAC R-30 (manufactured by Dainippon Ink and Chemicals, Inc., trade name) was mixed as a surfactant, and the mixture was dissolved in 80 g of propylene glycol monomethyl ether acetate. The solution was filtered using a polyethylene microfilter having a pore size of 0.10 μm, and further filtered, using a polyethylene microfilter having a pore site of 0.05 μm to prepare a solution of a resist underlayer film forming composition used for a lithography process using a multilayer film.

Example 5

To 20 g of PCzFL obtained in Synthetic Example 4, 0.06 g of MEGAFAC R-30 (manufactured by Dainippon Ink and Chemicals, Inc., trade name) was mixed as a surfactant, and the mixture was dissolved in 80 g of propylene glycol monomethyl ether acetate. The solution was filtered using a polyethylene microfilter having a pore size of 0.10 μm, and further filtered using a polyethylene microfilter having a pore size of 0.05 μm to prepare a solution of a resist underlayer film forming composition used for a lithography process using, a multilayer film.

Example 6

To 20 g of PCzFL obtained in Synthetic Example 4, 3.0 g of tetramethoxymethylglycoluril (manufactured by Mitsui Cytec, Ltd., a trade name of Powderlink 1174) as a cross-linking, agent, 0.30 g of pyridinium para-toluenesulfonate as a catalyst, and 0.06 g of MEGAFAC R-30 (manufactured by Dainippon Ink and Chemicals, Inc., trade name) as a surfactant were mixed, and the mixture was dissolved in 88 g of propylene glycol monomethyl ether acetate. The solution was filtered using a polyethylene microfilter having a pore size of 0.10 μm, and further filtered using a polyethylene microfilter having a pore size of 0.05 μm to prepare a solution of a resist underlayer film forming composition used for a lithography process using a multilayer film.

Comparative Example 1

To 20 g of a commercially available cresol novolak resin (a novolak resin obtained using cresol and formaldehyde), 0.06 g of MEGAFAC R-30 (manufactured by Dainippon Ink and Chemicals, Inc., trade name) was mixed as a surfactant, and the mixture was dissolved in 80 g of propylene glycol monomethyl ether acetate. The solution was filtered using a polyethylene microfilter having a pore size of 0.10 μm, and further filtered using a polyethylene microfilter having a pore size of 0.05 μm to prepare a solution of a resist underlayer film forming composition used for a lithography process using a multilayer film. The cresol novolak resin had a weight average molecular weight Mw of 4,000 and a degree of polydispersion Mw/Mn of 2.1 in terms of polystyrene by GPC.

(Measurement of Optical Parameter)

Each resist underlayer film solution prepared in Examples 1 to 6 was applied onto a silicon wafer using a spin coater and baked on a hot plate at 240° C. for 1 minute or at 400° C. for 2 minutes to form a resist underlayer film (a film thickness of 0.25 μm). The refractive indexes (n values) at a wavelength of 248 nm and a wavelength of 193 nm and the optical absorption coefficient (k value, also referred to as attenuation coefficient) of each resist underlayer film were determined using as spectroscopic ellipsometer. The results are shown in Table 1.

TABLE 1

Refractive index n and optical absorption coefficient k at wavelengths of 248 nm and 193 nm

| | | 248 nm | | 193 nm | |
|---|---|---|---|---|---|
| | | Refractive index n | Optical absorption coefficient k | Refractive index n | Optical absorption coefficient k |
| Example 1 | Film baked at 240° C. | 1.91 | 0.63 | 1.56 | 0.68 |
| | Film baked at 400° C. | 1.69 | 0.54 | 1.49 | 0.53 |
| Example 2 | Film baked at 240° C. | 1.89 | 0.58 | 1.54 | 0.67 |
| | Film baked at 400° C. | 1.69 | 0.52 | 1.49 | 0.53 |
| Example 3 | Film baked at 240° C. | 2.03 | 0.67 | 1.36 | 0.39 |
| | Film baked at 400° C. | 1.76 | 0.56 | 1.37 | 0.44 |
| Example 4 | Film baked at 240° C. | 1.92 | 0.46 | 1.54 | 0.73 |
| | Film baked at 400° C. | 1.72 | 0.48 | 1.52 | 0.60 |
| Example 5 | Film baked at 240° C. | 1.81 | 0.65 | 1.41 | 0.51 |
| | Film baked at 400° C. | 1.80 | 0.65 | 1.41 | 0.52 |
| Example 6 | Film baked at 240° C. | 1.78 | 0.59 | 1.45 | 0.46 |
| | Film baked at 400° C. | 1.77 | 0.60 | 1.43 | 0.48 |

(Dissolution Test to Resist Solvent)

Each solution of the resist underlayer film forming compositions prepared in Examples 1 to 6 and Comparative Example 1 was applied onto a silicon wafer using a spin coater, and baked on a hot plate at 400° C. for 2 minutes to form a resist underlayer film (a film thickness of 0.25 μm). Each resist underlayer film was immersed in ethyl lactate, propylene glycol monomethyl ether, propylene glycol monomethyl ether acetate, and cyclohexanone that are solvents used for a resist. These resist underlayer films were insoluble in each solvent.

(Measurement of Dry Etching Rate)

Each solution of the resist underlayer film forming compositions prepared in Examples 1 to 6 and Comparative Example 1 was applied onto a silicon wafer using a spin coater, and baked on a hot plate at 240° C. for 1 minute or at 400° C. for 2 minutes to form a resist underlayer film (a film thickness of 0.25 μm). In a similar manner, a phenol novolak resin (a commercial product, a weight average molecular weight Mw of 2,000 and a degree of polydispersion Mw/Mn of 2.5 in terms of polystyrene by GPC) solution was applied onto a silicon wafer using a spin coater, and baked at 205° C. for 1 minute to form a coating. The etching rate of the formed resist underlayer film was determined. A $CF_4$ gas was used as an etching gas to determine the dry etching rate.

The etching rate of the phenol novolak resin film (a film thickness of 0.25 μm) obtained by baking at 205° C. for 1 minute was regarded as 1.00, and the dry etching rate of each resist underlayer film of Examples 1 to 6 and Comparative Example 1 was compared. The results are shown in Table 2. The ratio of dry etching rate was determined, by (dry etching rate of resist underlayer film)/(dry etching rate of phenol novolak resin film).

TABLE 2

| | Ratio of dry etching rate | |
| --- | --- | --- |
| | Ratio of rate of film baked at 240° C. | Ratio of rate of film baked at 400° C. |
| Example 1 | 0.76 | 0.86 |
| Example 2 | 0.78 | 0.89 |
| Example 3 | 0.73 | 0.81 |
| Example 4 | 0.77 | 0.91 |
| Example 5 | 0.74 | 0.74 |
| Example 6 | 0.77 | 0.76 |
| Comparative Example 1 | 1.00 | 1.15 |

(Heat Resistance Test of Resist Underlayer Film)

Each solution of the resist underlayer film forming compositions prepared in Examples 1 to 6 and Comparative Example 1 was applied onto a silicon wafer using a spin coater, and baked on a hot plate at 240° C. for 1 minute or at 400° C. for 2 minutes to form a resist underlayer film (a film thickness of 0.25 μm). The obtained film was heated while raising the temperature from room temperature (about 20° C.) at the rate of 10° C. per minute to perform thermogravimetric analysis in the atmosphere, and the temperature at which the weight was reduced by 5 percent was determined. The results are shown in Table 3.

TABLE 3

| | Temperature at 5% weight reduction of resist underlayer film | |
| --- | --- | --- |
| | Baked film of film baked at 240° C. $Td_{5\%}$ (° C.) | Baked film of film baked at 400° C. $Td_{5\%}$ (° C.) |
| Example 1 | 383 | 417 |
| Example 2 | 396 | 366 |
| Example 3 | 304 | 396 |
| Example 4 | 401 | 420 |
| Example 5 | 270 | 500 |
| Example 6 | 348 | 405 |
| Comparative Example 1 | 328 | |

(Evaluation of Thermophysical Property of Polymer)

The 5% weight loss temperature ($Td_{5\%}$) and the glass transition temperature (Tg) of each polymer obtained in Synthetic Examples 5 to 13 and Comparative Synthetic Examples 1 and 2 were determined. The results are shown in Table 4.

TABLE 4

| | Evaluation of thermophysical property of polymer | |
| --- | --- | --- |
| | 5% weight loss temperature $Td_{5\%}$ (° C.) | Glass transition temperature Tg (° C.) |
| Synthetic Example 5 | 438 | 210 |
| Synthetic Example 6 | 480 | 200 |
| Synthetic Example 7 | 361 | Not observed |
| Synthetic Example 8 | 358 | 234 |
| Synthetic Example 9 | 387 | 204 |
| Synthetic Example 10 | 384 | 262 |
| Synthetic Example 11 | 394 | 274 |
| Synthetic Example 12 | 448 | 173 |
| Synthetic Example 13 | 415 | 191 |
| Comparative Synthetic Example 1 | 337 | 128 |
| Comparative Synthetic Example 2 | 209 | 149 |

As shown in Table 4, the carbazole novolak resins of the present invention have a higher 5% weight loss temperature and a higher glass transition temperature than those of the novolak resin without a carbazole skeleton. This reveals that the carbazole novolak resins have very high heat resistance.

(Evaluation of Solvent Solubility of Polymer)

To 90 parts by mass of propylene glycol monomethyl ether (PGME), propylene glycol monomethyl ether acetate (PGMEA), cyclohexanone (CHN), or N-methyl-2-pyrrolidone (NMP), 10 parts by mass of each polymer obtained in Synthetic Examples 5 to 13 and Comparative Synthetic Examples 1 and 2 was added, and the whole was stirred at room temperature (about 25° C.) for 24 hours to evaluate solvent solubility. The evaluation was visually carried out, and a polymer homogeneously dissolved was regarded as A and a polymer observing an insoluble substance was regarded as B. The results are shown in Table 5.

TABLE 5

| | Evaluation of solvent solubility of polymer | | | |
| --- | --- | --- | --- | --- |
| | PGMA | PGMEA | CHN | NMP |
| Synthetic Example 5 | A | A | A | A |
| Synthetic Example 6 | A | A | A | A |
| Synthetic Example 7 | A | A | A | A |
| Synthetic Example 8 | A | A | A | A |
| Synthetic Example 9 | A | A | A | A |
| Synthetic Example 10 | A | A | A | A |
| Synthetic Example 11 | A | A | A | A |
| Synthetic Example 12 | B | B | A | A |
| Synthetic Example 13 | B | B | A | A |
| Comparative Synthetic Example 1 | B | A | A | A |
| Comparative Synthetic Example 2 | A | A | A | A |

As shown in Table 5, the polymers of the present invention are soluble in various solvents, and are revealed to be a material having excellent solvent solubility.

Production of High Refractive Index Film

Examples 7 to 15

Under an air atmosphere, to a 10 mL recovery flask, 1.00 g of each polymer obtained in Synthetic Examples 5 to 13 and 9.00 g of cyclohexanone were added. Each mixture was stirred for 3 hours until the solution became homogeneous to give a high refractive index film forming composition having a resin concentration of 10% by mass.

The obtained high refractive index film forming composition was applied onto a glass substrate by spin coating (200 rpm for 5 seconds followed by 2,000 rpm for 30 seconds), and heated on a hot plate at 100° C. for 1 minute and then at 250° C. for 5 minutes to give a high refractive index film.

Comparative Examples 2 and 3

A film forming composition and a thin film formed from the composition were produced in a similar procedure to that in Examples 7 to 15 except that the polymer used was replaced with each novolak resin obtained in Comparative Synthetic Examples 1 and 2.

(Stability Evaluation of High Refractive Index Film Forming Composition)

Each high refractive index film forming composition prepared in Examples 7 to 15 was placed in a vial and left in conditions at 23° C. and 55 RH %. After 1 month without treatment, the composition was visually observed. No solute was precipitated in any high refractive index film forming composition. This reveals that the high refractive index film forming composition has excellent storage stability.

(Evaluation of Optical Property of High Refractive Index Film)

The film thickness and refractive indexes at wavelengths of 550 nm and 633 nm of each (high refractive index) film obtained in Examples 7 to 15 and Comparative Examples 2 and 3 were determined. The results are shown in Table 6. The light transmission spectrum in a wavelength range from 300 nm to 800 nm of each thin film is shown in FIG. 16 to FIG. 26.

TABLE 6

Evaluation of optical property of high refractive index film

| | Refractive index | | Film thickness |
|---|---|---|---|
| | 550 nm | 633 nm | (nm) |
| Example 7 | 1.76 | 1.75 | 185 |
| Example 8 | 1.77 | 1.75 | 156 |
| Example 9 | 1.80 | 1.77 | 324 |
| Example 10 | 1.77 | 1.75 | 312 |
| Example 11 | 1.77 | 1.75 | 312 |
| Example 12 | 1.77 | 1.75 | 316 |
| Example 13 | 1.75 | 1.75 | 316 |
| Example 14 | 1.72 | 1.70 | 316 |
| Example 15 | 1.74 | 1.72 | 314 |
| Comparative Example 2 | 1.80 | 1.78 | 277 |
| Comparative Example 3 | 1.71 | 1.69 | 293 |

As shown in Table 6, the high refractive index film of the present invention had a refractive index of 132 to 180 at a wavelength of 550 nm and a refractive index of 1.70 to 1.77 at a wavelength of 633 nm, and this reveals that even the resin alone has a very high refractive index.

Furthermore, the light transmission spectra shown in FIG. 16 to FIG. 26 reveal that the carbazole novolak resin of the present invention has high transparency especially in a visible light region.

INDUSTRIAL APPLICABILITY

The resist underlayer film forming composition used for a lithography process of the present invention can form a resist underlayer film that has a similar selection ratio of dry etching rate to that of a resist or a smaller selection ratio of dry etching rate than that of a resist and that has a smaller selection ratio of dry etching rate than that of a semiconductor substrate. The resist underlayer film formed from the resist underlayer film forming composition of the present invention has advantages as a planarizing film and a bottom anti-reflective coating and heat resistance, and does no cause intermixing with a resist composition. Thus, the resist underlayer film forming composition can be effectively used for the formation of a fine pattern in a lithography process of semiconductor devices. It was also revealed that the resist underlayer film material of the present invention has heat resistance capable of forming a hard mask on an upper layer by deposition.

The polymer containing the unit structures of Formula (1), Formula (2), and Formula (3) of the present invention has excellent transparency in a visible region, excellent heat resistance, and high refractive index as well as excellent solubility to various solvents. Therefore, the polymer is applicable as a high refractive index film that is widely used for optical members such as a protective film for to liquid crystal display device, a TFT array planarizing film, an overcoat for a color filter and the like, a spacer material, a film for improving light extraction of an EL display, a layer for improving light receiving of an image sensing device, and a layer for improving light extraction in an LED device, and as a high refractive index film forming composition to form the film.

The invention claimed is:

1. A method for forming a resist pattern used in production of a semiconductor, the method comprising applying a resist underlayer film forming composition on a semiconductor substrate and baking the resultant coating to form an underlayer film, wherein the resist underlayer film forming composition comprises a polymer comprising:

a unit structure of Formula (1):

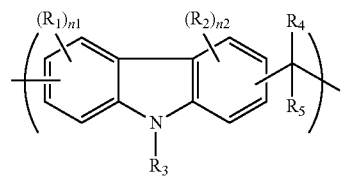

wherein, in Formula (1), each of $R_1$ and $R_2$ is a group selected from a group consisting of a hydrogen atom, a halogen group, a nitro group, an amino group, a hydroxy group, a $C_{1-10}$ alkyl group, a $C_{2-10}$ alkenyl group, a $C_{6-40}$ aryl group, and a combination of them, the alkyl group, the alkenyl group, or the aryl group optionally containing an ether linkage, a ketone linkage, or an ester linkage;

$R_3$ is a group selected from a group consisting of a hydrogen atom, a $C_{1-10}$ alkyl group, a $C_{2-10}$ alkenyl group, a $C_{6-40}$ aryl group, and a combination of them, the alkyl group, the alkenyl group, or the aryl group optionally containing an ether linkage, a ketone linkage, or an ester linkage;

$R_4$ is a $C_{6-40}$ aryl group or a heterocyclic group optionally substituted with a halogen group, a nitro group, an amino group, or a hydroxy group;

$R_5$ is a hydrogen atom or a $C_{1-10}$ alkyl group, a $C_{6-40}$ aryl group, or a heterocyclic group optionally substituted with a halogen group, a nitro group, an amino group, or a hydroxy group;

$R_4$ and $R_5$ optionally form a ring together with a carbon atom, the carbon atom being bonded to $R_4$ and $R_5$; and each of n1 and n2 is an integer of 1 to 3.

2. A production method of a semiconductor device, the production method comprising:

forming a resist underlayer film on a semiconductor substrate from a resist underlayer film forming composition;

forming a resist film on the resist underlayer film;

forming a resist pattern on the resist film by application of light or an electron beam and development;

etching the underlayer film according to the resist pattern; and fabricating the semiconductor substrate using the patterned underlayer film, wherein the resist underlayer film forming composition comprises a polymer comprising:

a unit structure of Formula (1):

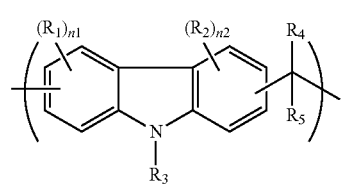

wherein, in Formula (1), each of $R_1$ and $R_2$ is a group selected from a group consisting of a hydrogen atom, a halogen group, a nitro group, an amino group, a hydroxy group, a $C_{1-10}$ alkyl group, to $C_{2-10}$ alkenyl group, as $C_{6-40}$ aryl group, and a combination of them, the alkyl group, the alkenyl group, or the aryl group optionally containing an ether linkage, a ketone linkage, or an ester linkage;

$R_3$ is as group selected from a group consisting of a hydrogen atom, a $C_{1-10}$ alkyl group, a $C_{2-10}$ alkenyl group, a $C_{6-40}$ aryl group, and a combination of them, the alkyl group, the alkenyl group, or the aryl group optionally containing an ether linkage, a ketone linkage, or an ester linkage;

$R_4$ is a $C_{6-40}$ aryl group or a heterocyclic group optionally substituted with a halogen group, as nitro group, an amino group, or a hydroxy group;

$R_5$ is a hydrogen atom or a $C_{1-10}$ alkyl group, a $C_{6-40}$ aryl group, or a heterocyclic group optionally substituted with as halogen group, a nitro group, an amino group, or a hydroxy group;

$R_4$ and $R_5$ optionally form a ring together with a carbon atom, the carbon atom being bonded to $R_4$ and $R_5$; and each of n1 and n2 is an integer of 1 to 3.

3. A production method of a semiconductor device, the production method comprising:
forming a resist underlayer film on a semiconductor substrate from a resist underlayer film forming composition;
forming a hard mask on the resist underlayer film;
further forming a resist film on the hard mask;
forming a resist pattern on the resist film by application of light or an electron beam and development;
etching the hard mask according to the resist pattern;
etching the resist underlayer film according to the patterned hard mask; and
fabricating the semiconductor substrate using the patterned resist underlayer film,
wherein the resist underlayer film forming composition comprises a polymer comprising:
a unit structure of Formula (1):

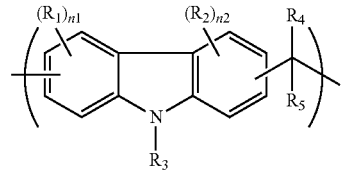

wherein, in Formula (1), each of $R_1$ and $R_2$ is a group selected from a group consisting of a hydrogen atom, a halogen group, a nitro group, an amino group, a hydroxy group, a $C_{1-10}$ alkyl group, a $C_{2-10}$ alkenyl group, a $C_{6-40}$ aryl group, and a combination of them, the alkyl group, the alkenyl group, or the aryl group optionally containing an ether linkage, a ketone linkage, or an ester linkage;

$R_3$ is a group selected from a group consisting of a hydrogen atom, a $C_{1-10}$ alkyl group, a $C_{2-10}$ alkenyl group, a $C_{6-40}$ aryl group, and a combination of them, the alkyl group, the alkenyl group, or the aryl group optionally containing an ether linkage, a ketone linkage, or an ester linkage;

$R_4$ is a $C_{6-40}$ aryl group or a heterocyclic group optionally substituted with a halogen group, a nitro group, an amino group, or a hydroxy group;

$R_5$ is a hydrogen atom or a $C_{1-10}$ alkyl group, a $C_{6-40}$ aryl group, or a heterocyclic group optionally substituted with a halogen group, a nitro group, an amino group, or a hydroxy group;

$R_4$ and $R_5$ optionally form a ring together with a carbon atom, the carbon atom being bonded to $R_4$ and $R_5$; and each of n1 and n2 is an integer of 1 to 3.

4. The production method according to claim 3, wherein the hard mask is formed by depositing an inorganic substance on the resist underlayer film.

* * * * *